(12) United States Patent
Yang et al.

(10) Patent No.: US 11,121,033 B2
(45) Date of Patent: Sep. 14, 2021

(54) METHOD FOR FABRICATING SEMICONDUCTOR DEVICE

(71) Applicant: SK hynix Inc., Icheon-si (KR)

(72) Inventors: Ki-Hong Yang, Seongnam-si (KR); Ki-Hong Lee, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 23 days.

(21) Appl. No.: 16/573,047

(22) Filed: Sep. 17, 2019

(65) Prior Publication Data
US 2020/0185274 A1   Jun. 11, 2020

(30) Foreign Application Priority Data
Dec. 7, 2018 (KR) .......................... 10-2018-0157330

(51) Int. Cl.
*H01L 21/768* (2006.01)
*H01L 27/1157* (2017.01)

(52) U.S. Cl.
CPC .. *H01L 21/76897* (2013.01); *H01L 21/76805* (2013.01); *H01L 21/76808* (2013.01); *H01L 21/76877* (2013.01); *H01L 27/1157* (2013.01); *H01L 2221/1026* (2013.01)

(58) Field of Classification Search
None
See application file for complete search history.

(56) References Cited

U.S. PATENT DOCUMENTS

| 9,905,570 B2 * | 2/2018 | Shin .................. H01L 29/66833 |
| 9,991,282 B1 | 6/2018 | Shimizu et al. |
| 2011/0151667 A1 * | 6/2011 | Hwang ............... H01L 23/5226 438/667 |

* cited by examiner

*Primary Examiner* — Zandra V Smith
*Assistant Examiner* — Lawrence C Tynes, Jr.
(74) *Attorney, Agent, or Firm* — William Park & Associates Ltd.

(57) ABSTRACT

A method for fabricating a semiconductor device includes forming a through-hole penetrating through an alternating stack pattern and forming a gap-fill layer, wherein a sacrificial gap-fill layer of the gap-fill layer fills the through-hole. The method also includes forming a mask layer over the alternating stack pattern and over the gap-fill layer, wherein the mask layer includes a self-aligned opening overlapping the filled through-hole and overlapping a portion of an uppermost material layer of the alternating stack pattern adjacent to the filled through-hole. The method further includes forming a first contact hole through the alternating stack pattern by performing a single etch using both the mask layer and the portion of the uppermost material layer as etch barriers to remove, through the self-aligned opening, the sacrificial gap-fill layer filling the through-hole.

15 Claims, 30 Drawing Sheets

METHOD FOR FABRICATING SEMICONDUCTOR DEVICE

CROSS-REFERENCE TO RELATED APPLICATIONS

The present application claims priority under 35 U.S.C. § 119(a) to Korean Patent Application No. 10-2018-0157330, filed on Dec. 7, 2018, which is incorporated herein by reference in its entirety.

BACKGROUND

1. Field

Embodiments relate to a semiconductor device, and more particularly, to a method for fabricating a semiconductor device including a vertical memory device.

2. Description of the Related Art

A semiconductor device may be increased in capacity, for example, memory capacity, by the miniaturization technique. Recently, a three-dimensional semiconductor device has been proposed for a larger capacity. The three-dimensional semiconductor device may include a vertical NAND. The three-dimensional semiconductor device may be formed through a process of forming an alternating stack of different kinds of materials and then forming a vertical opening in the alternating stack through an etch process. A semiconductor layer which becomes a channel may be formed in the vertical opening. Forming these vertical openings is associated with time and fabrication costs.

SUMMARY

In accordance with an embodiment of the present disclosure, a method for fabricating a semiconductor device includes forming a dielectric layer on a first lower wiring structure, wherein the first lower wiring structure is electrically conductive, and forming an alternating stack structure on the dielectric layer, wherein the alternating stack structure comprises first and second material layers alternately stacked with one another. The method also includes forming an alternating stack pattern by etching the alternating stack structure, forming a through-hole penetrating through the alternating stack pattern, and forming a gap-fill layer, wherein a sacrificial gap-fill layer of the gap-fill layer fills the through-hole. The method further includes forming a mask layer over the alternating stack pattern and over the gap-fill layer, wherein the mask layer comprises a self-aligned opening overlapping the filled through-hole and overlapping a portion of an uppermost material layer of the first and second material layers adjacent to the filled through-hole. The method additionally includes forming a first contact hole through the alternating stack pattern by performing a single etch using both the mask layer and the portion of the uppermost material layer as etch barriers to remove, through the self-aligned opening, the sacrificial gap-fill layer filling the through-hole.

In accordance with another embodiment of the present disclosure, a method for fabricating a vertical memory device includes forming an alternating stack structure on a lower structure, wherein the alternating stack structure comprises first and second material layers alternately stacked with one another, and forming first and second alternating stack patterns by etching the alternating stack structure, wherein the first and second alternating stack patterns are isolated from each other by an isolation portion. The method also includes forming a through-hole penetrating through the second alternating stack pattern, forming a first gap-fill layer, wherein the first gap-fill layer fills the isolation portion, and forming a second gap-fill layer, wherein the second gap-fill layer fills the through-hole. The method further includes forming a mask layer over the first and second alternating stack patterns and over the first and second gap-fill layers, wherein the mask layer comprises a hole type opening overlapping the first gap-fill layer and a self-aligned opening overlapping the filled through-hole and overlapping a portion of an uppermost material layer of the first and second material layers adjacent to the filled through-hole. The method additionally includes forming a first contact hole through the first gap-fill layer by performing a single etch using the mask layer as an etch barrier to remove, through the hole type opening, a portion of the first gap-fill layer. The method also includes forming a second contact hole through the second alternating stack pattern by performing the single etch using both the mask layer and the portion of the uppermost material layer as etch barriers to remove, through the self-aligned opening, the second gap-fill layer filling the through-hole.

BRIEF DESCRIPTION OF THE DRAWINGS

The accompanying figures, where like reference numbers refer to identical or functionally similar elements throughout the separate views, form part of the specification and illustrate embodiments in accordance with the included claims.

Figure 1A:
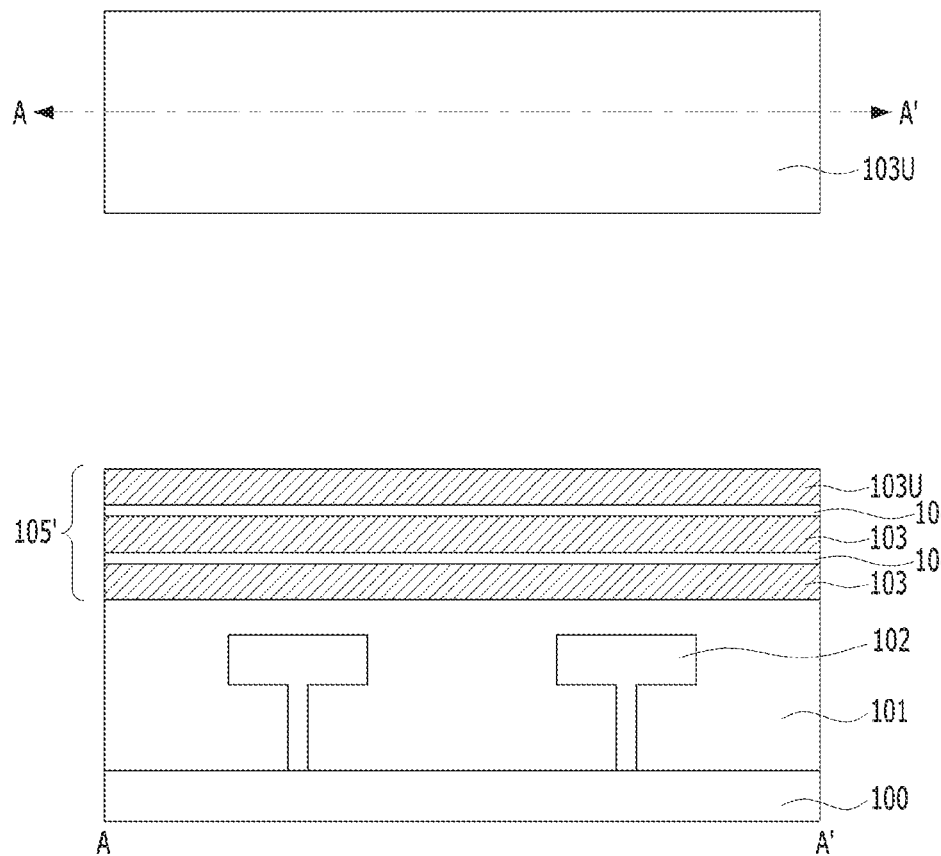
FIGS. 1A to 1G are cross-sectional views illustrating an example of a method for fabricating a semiconductor device, in accordance with embodiments of the present disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present teachings. In addition, the description and drawings do not necessarily require the order presented. It will be further appreciated that certain actions and/or steps may be described or depicted in a particular order of occurrence while those skilled in the art will understand that such specificity with respect to sequence is not actually required.

The apparatus and method components have been represented, where appropriate, by conventional symbols in the drawings, showing only those specific details that are pertinent to understanding the embodiments of the present teachings so as not to obscure the disclosure with details that will be readily apparent to those of ordinary skill in the art having the benefit of the description herein.

DETAILED DESCRIPTION

Various embodiments of the present disclosure are described in detail below with reference to the accompanying drawings. Some embodiments are directed to a method for fabricating a semiconductor device having useful electrical characteristics. For example, a number of embodiments are directed to methods of forming hybrid contacts, in which a dual etch barrier may be applied to form a contact hole landing on a lower metal layer. The dual etch barrier may include a stack of polysilicon and photoresist layers.

During the forming of the contact hole through the dual etch barrier containing polysilicon, it is possible to etch oxide and polysilicon at a time using an etch selectivity, without separately etching the oxide and polysilicon.

FIGS. 1A to 1G are cross-sectional views illustrating an example of a method for fabricating a semiconductor device, in accordance with embodiments of the present teachings.

Referring to FIG. 1A, a lower structure including an inter-layer dielectric layer (ILD) 101 and lower wirings 102 are formed on a substrate 100. The ILD 101 may include oxide, nitride, or a combination thereof. The ILD 101 may include silicon oxide. The ILD 101 may include BPSG, SiO$_2$, a spin-on-dielectric (SOD) substance, a low-k material, or any combinations thereof. Each of the lower wirings 102 may be connected to the substrate 100. The lower wiring 102 may be formed by a damascene process. The damascene process may be performed by any one of a single damascene process, a dual damascene process, a via-first dual damascene process, and a trench-first dual damascene process. The ILD 101 may include first and second ILDs (reference numerals omitted). The lower wiring 102 may penetrate the first ILD, and the second ILD may be formed on the first ILD in which the lower wiring 102 is formed. The lower wiring 102 may include a metal-based material. The lower wiring 102 may include a metal, metal nitride, or a combination thereof. The lower wiring 102 may include tungsten, aluminum, molybdenum, titanium nitride, tantalum nitride, tungsten silicide, titanium silicide, nickel silicide, or any combinations thereof.

The lower wiring 102 is shown as a wiring structure. In some embodiments, the lower wiring 102 represents a plurality of electrically interconnected wiring structures, such as the first, second, and third wiring structures 18L, 18M, and 18U shown in FIGS. 4D and 5A. For example, the lower wiring 102 might represent a vertical interconnection shown in FIGS. 4D and 5A.

Subsequently, an upper stack structure 105' may be formed on the ILD 101. The upper stack structure 105' may include a plurality of dielectric layers and a plurality of conductive layers. The upper stack structure 105' may include silicon nitride, silicon oxide, or polysilicon. In addition, the upper stack structure 105' may be a multi-layer structure including silicon nitride, silicon oxide, and polysilicon.

The upper stack structure 105' may include an alternating stack 103/104. The alternating stack 103/104 may include a plurality of polysilicon layers 103 and a plurality of dielectric layers 104 which are alternately stacked on one another, the lowermost and uppermost layers of the alternating stack 103/104 may be the polysilicon layers 103. The polysilicon layers 103 may have larger thicknesses than the dielectric layers 104. Each of the dielectric layers 104 of the alternating stack 103/104 may include silicon oxide. The uppermost polysilicon layer of the alternating stack 103/104 is denoted by the reference numeral '103U.' The uppermost polysilicon layer 103U may serve as a hard mask during a subsequent etch process. Other materials of the hard mask besides the uppermost polysilicon layer 103U may include nitride, a metallic material, or a combination thereof.

Figure 1B:
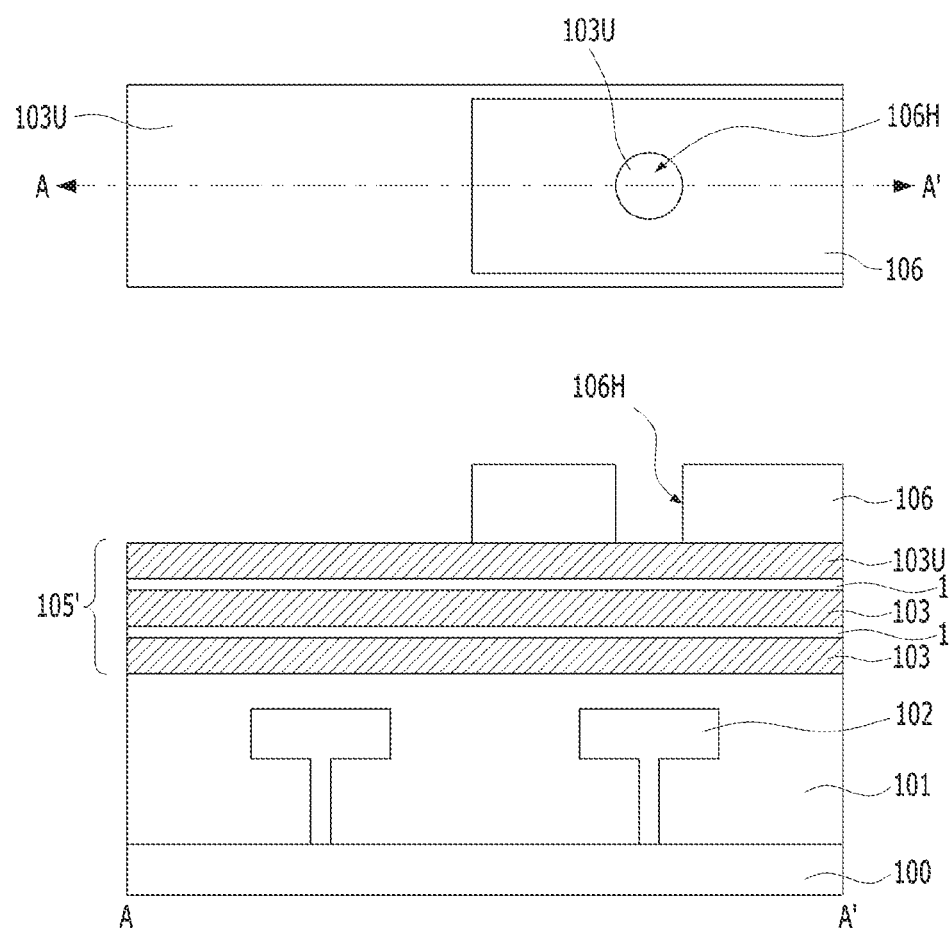

Referring to FIG. 1B, a first mask layer 106 is formed. The first mask layer 106 may partially cover a surface of the uppermost polysilicon layer 103U. The first mask layer 106 may include an opening 106H. The opening 106H may have a hole shape. The first mask layer 106 may be referred to as a "cut mask layer."

Figure 1C:
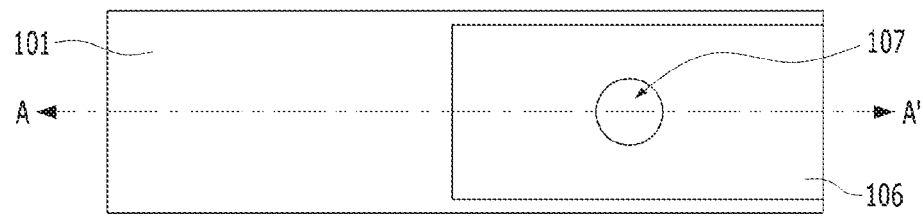
Figure 1C:
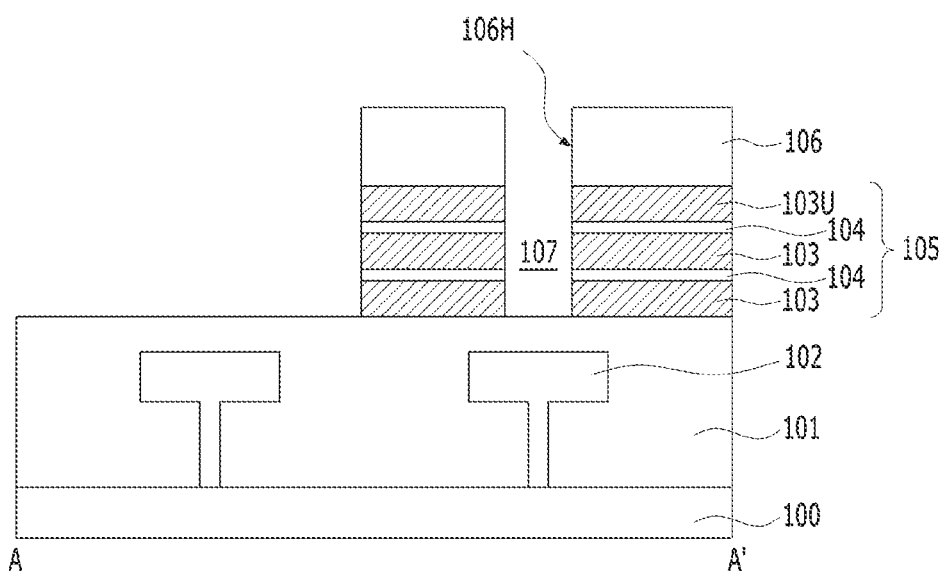

Referring to FIG. 1C, an upper structure 105 is formed. In order to form the upper structure 105, the upper stack structure 105' may be etched with the first mask layer 106 as an etch barrier. The upper structure 105 may include an alternating stack pattern 103/104. The alternating stack pattern 103/104 may have a structure in which a plurality of polysilicon layers 103 and a plurality of dielectric layer patterns 104 are alternately stacked on one another. The alternating stack pattern 103/104 may include the uppermost polysilicon layer 103U.

A portion of the upper structure 105 may be etched through the opening 106H of the first mask layer 106 to form a through-hole 107 penetrating the upper structure 105. A lower end of the through-hole 107 may expose an upper surface of the ILD 101.

As described above, in accordance with an embodiment, the through-hole 107 may be formed at the same time as the cutting of the upper stack structure 105'. This is possible by forming the opening 106H of the first mask layer 106 where the through-hole 107 is to be formed.

Figure 1D:
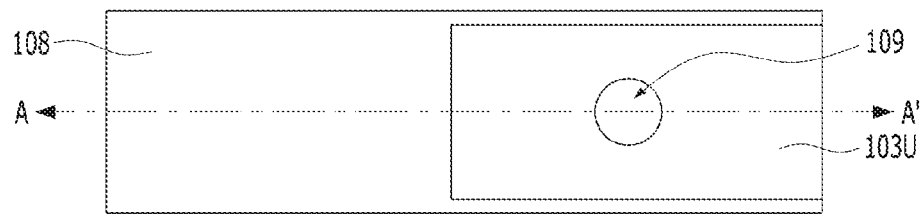
Figure 1D:
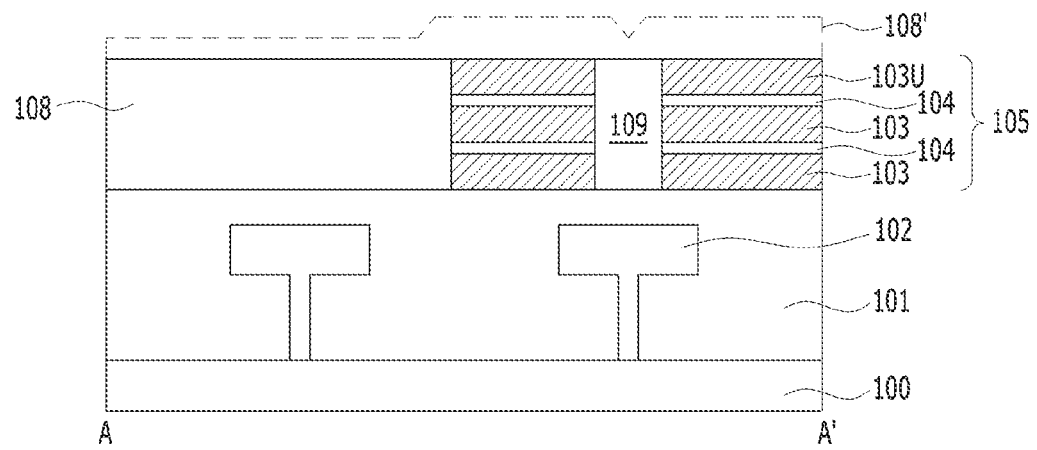

Referring to FIG. 1D, the first mask layer 106 is removed, and a gap-fill layer 108 is then formed. The gap-fill layer 108 may be formed through a process of forming a dielectric material 108' on the upper structure 105 and then planarizing the dielectric material 108' until an upper surface of the upper structure 105 is exposed. For example, the gap-fill layer 108 may include silicon oxide. The gap-fill layer 108 may gap-fill the through-hole 107 without a void. An upper surface of the gap-fill layer 108 may be at the same level as the upper surface of the upper structure 105. The gap-fill layer 108 may have a shape surrounding sidewalls of the upper structure 105, and include a sacrificial gap-fill layer 109 filling the through-hole 107.

As the gap-fill layer 108 is formed as described above, a single-layered layer and a multi-layered layer may be formed. The single-layered layer may include the gap-fill layer 108, and the multi-layered layer may include the upper structure 105 including the uppermost polysilicon layer 103U, the through-hole 107, and the sacrificial gap-fill layer 109 filling the through-hole 107. The uppermost polysilicon layer 103U may have a higher etch selectivity than the gap-fill layer 108 and the sacrificial gap-fill layer 109. That is to say, the gap-fill layer 108 and the sacrificial gap-fill layer 109 have lower etch rates than the uppermost polysilicon layer 103U.

Figure 1E:
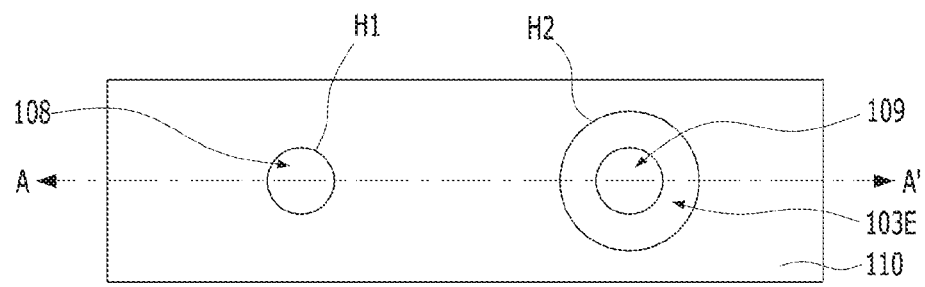
Figure 1E:
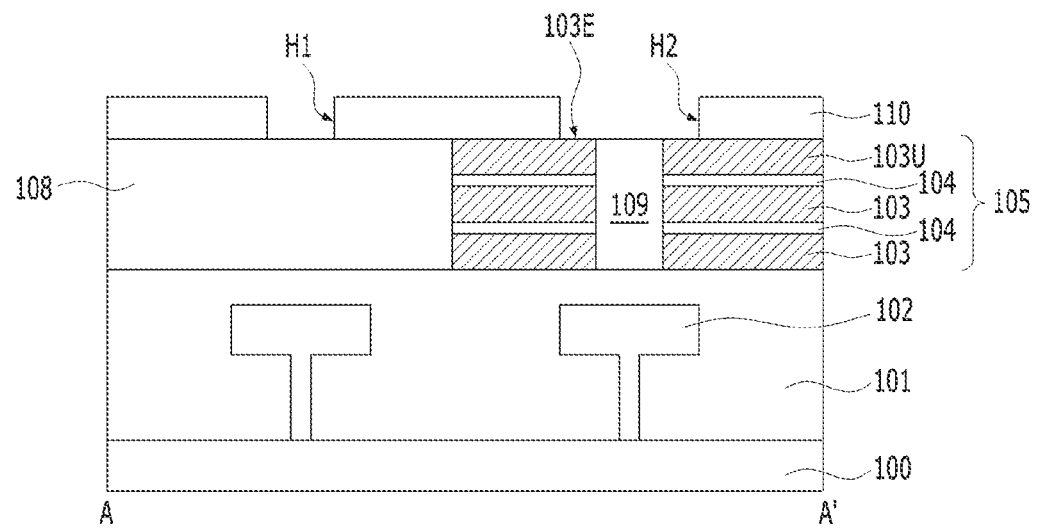

Referring to FIG. 1E, a second mask layer 110 is formed. The second mask layer 110 may include a hole type opening H1 and a self-aligned opening H2. The hole type opening H1 may expose the upper surface of the gap-fill layer 108, and the self-aligned opening H2 may expose an upper surface of the sacrificial gap-fill layer 109. The self-aligned opening H2 may have a larger width than the hole type opening H1. The self-aligned opening H2 may have a larger width than the through-hole 107. Accordingly, the self-aligned opening H2 may expose a portion of the uppermost polysilicon layer 103U simultaneously while exposing the sacrificial gap-fill layer 109. An edge 103E of the uppermost polysilicon layer 103U may be exposed by the self-aligned opening H2.

Figure 1F:
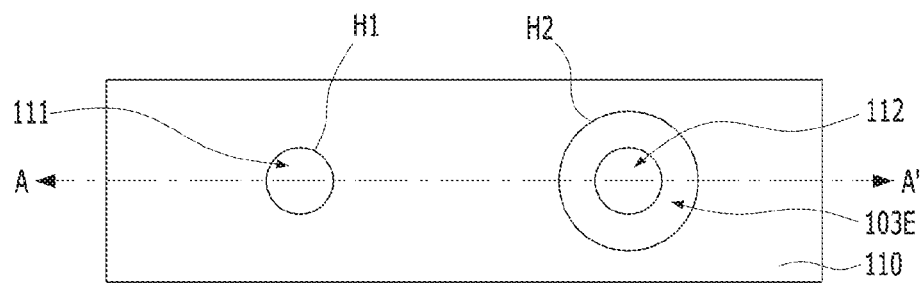
Figure 1F:
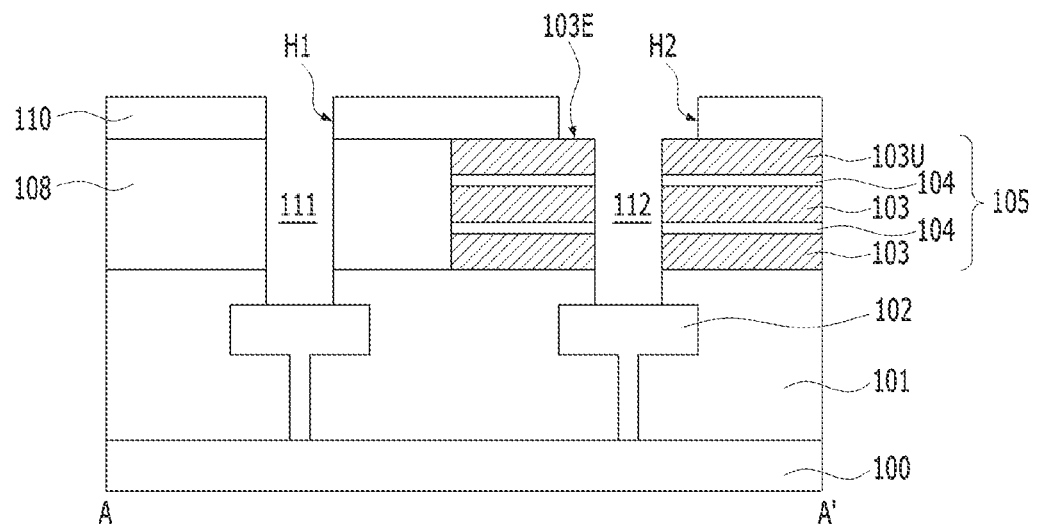

Referring to FIG. 1F, portions of the gap-fill layer 108 exposed by the second mask layer 110 are etched. Accordingly, a first contact hole 111 and a second contact hole 112 may be formed. The first contact hole 111 may be formed by etching a portion of the gap-fill layer 108. The second contact hole 112 may be formed by fully etching the sacrificial gap-fill layer 109. The second contact hole 112 may have a shape of the reopened through-hole 107 of the upper structure 105. In order to etch the sacrificial gap-fill layer 109, the second mask layer 110 and the uppermost polysilicon layer 103U may be used as etch barriers. In order to etch the gap-fill layer 108, the second mask layer 110 may be used as an etch barrier.

As described above, the first contact hole 111 and the second contact hole 112 may be formed simultaneously, and the gap-fill layer 108 and the sacrificial gap-fill layer 109 may be etched by the same etch gas at the same time. Accordingly, a mask layer for forming the first contact hole 111 and a separate mask layer for separately forming the second contact hole 112 are not needed. In other words, the second mask layer 110 alone may be used to form the first contact hole 111 and the second contact hole 112 simultaneously. When the gap-fill layer 108 and the sacrificial gap-fill layer 109 include silicon oxide, a silicon oxide etch gas may be used. Because the uppermost polysilicon layer 103U has a selectivity against silicon oxide etch gas, the sacrificial gap-fill layer 109 may be easily etched. That is to say, the gap-fill layer 108 and the sacrificial gap-fill layer 109 including silicon oxide have greater etch rates than the uppermost polysilicon layer 103U when using a silicon oxide etch gas.

The uppermost polysilicon layer 103U may be used as an etch barrier or a hard mask when the sacrificial gap-fill layer 109 is etched. As above, the second contact hole 112 may be formed using a dual etch barrier of the second mask layer 110 and the uppermost polysilicon layer 103U. The first contact hole 111 may be formed using a single etch barrier of the second mask layer 110.

Subsequently, the first contact hole 111 and the second contact hole 112 may be extended downward to expose an upper surface of the lower wiring 102. To extend the first contact hole 111 and the second contact hole 112 downward, an upper portion of the ILD 101 is etched. During the etch process for extending the second contact hole 112 downward, the uppermost polysilicon layer 103U and the second mask layer 110 may be used as a dual etch barrier.

The second contact hole 112 may be self-aligned with the edge 103E of the uppermost polysilicon layer 103U.

Figure 1G:
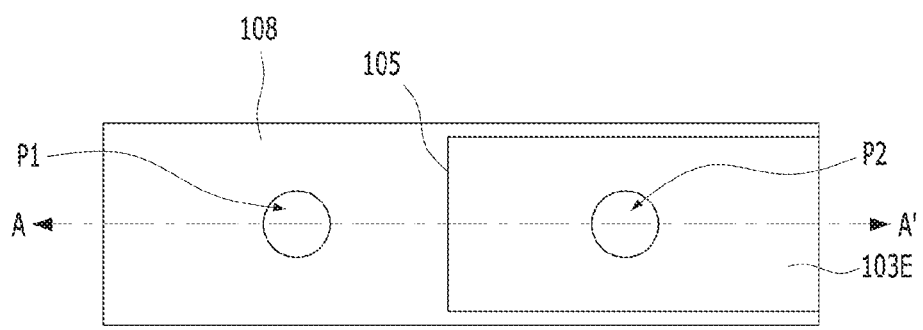
Figure 1G:
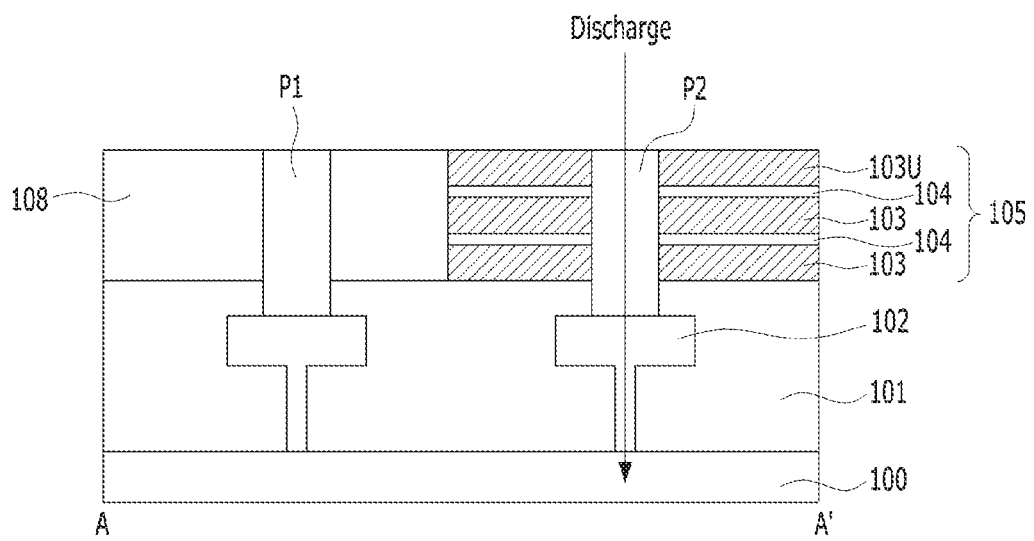

Referring to FIG. 1G, the second mask layer 110 is removed after etching to extend the first contact hole 111 and the second contact hole 112 downward to the upper surface of the lower wiring 102.

Subsequently, each of the first and second contact holes 111 and 112 may be filled with a conductive material. For example, the first and second contact holes 111 and 112 may be filled with a metal-based material, forming a first conductive plug P1 and a second conductive plug P2 in the first and second contact holes 111 and 112, respectively.

Figure 2A:
FIGS. 2A to 2B are cross-sectional views illustrating a method for fabricating a semiconductor device, in accordance with a comparative example.
Figure 2A:
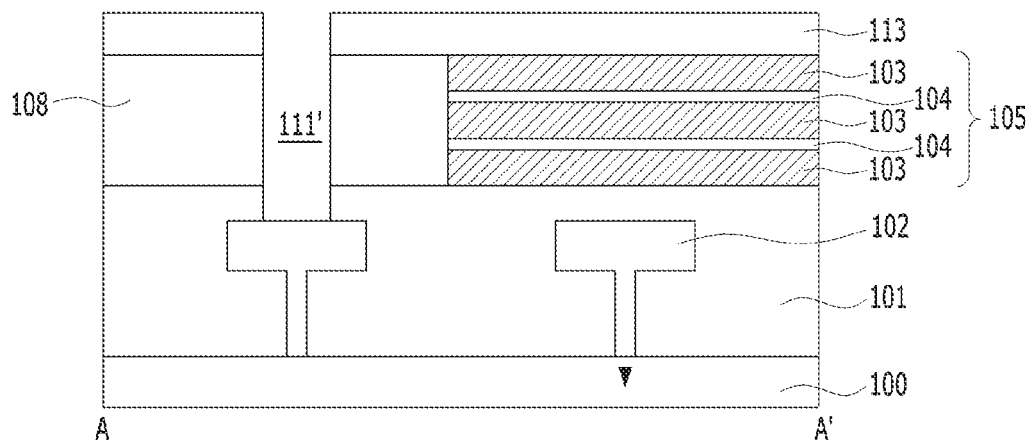
Figure 2B:
Figure 2B:
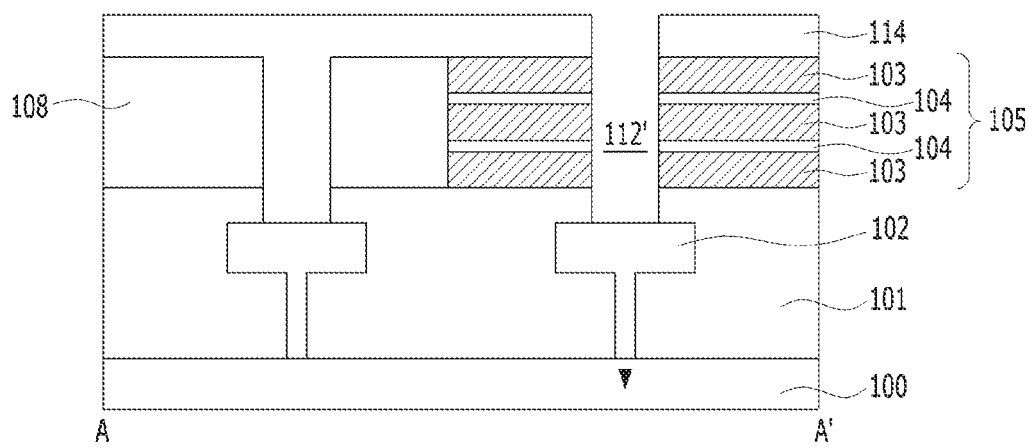

FIGS. 2A to 2B are cross-sectional views illustrating a method for fabricating a semiconductor device in accordance with a comparative example.

Referring to FIG. 2A, a gap-fill layer 108 is etched with a third mask layer 113 used as an etch barrier in order to form a first contact hole 111'.

Referring to FIG. 2B, after the third mask layer 113 is removed, an upper structure 105 is etched using a fourth mask layer 114 as an etch barrier to form a second contact hole 112'.

For the comparative example, because a photolithography process is performed twice, that is, the third mask layer 113 and the fourth mask layer 114 are formed to form the first contact hole 111' and the second contact hole 112', respectively, the comparative process is more complicated, and also associated with an increased cost, as compared to the method described with reference to FIGS. 1A to 1G.

In accordance with teachings of the present disclosure, the first contact hole 111 and the second contact hole 112 may be formed simultaneously through one photolithography process using the second mask layer 110, as described above with reference to FIGS. 1A to 1G. Accordingly, the process of forming the first 111 and second 112 contact holes is simplified while the process cost is reduced.

FIGS. 3A to 3D are cross-sectional views illustrating another example of a method for fabricating a semiconductor device, in accordance with embodiments of the present teachings.

Figure 3A:
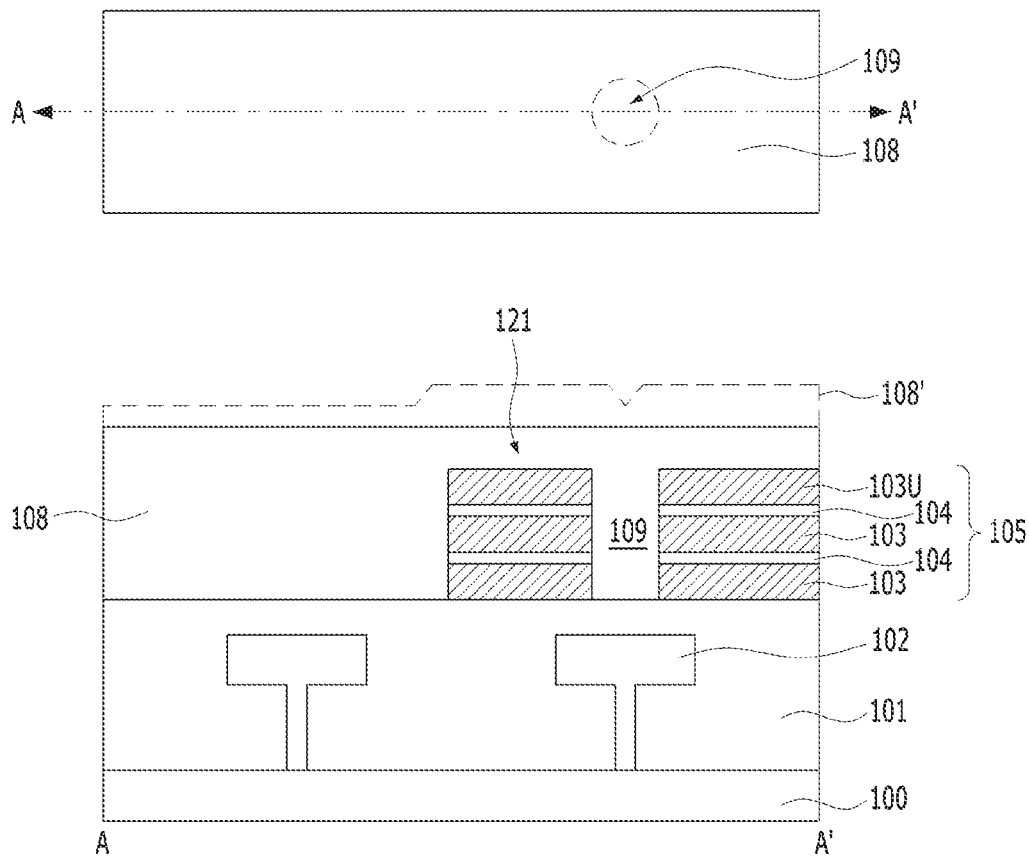
FIGS. 3A to 3D are cross-sectional views illustrating another example of a method for fabricating a semiconductor device, in accordance with embodiments of the present disclosure.

Referring to FIG. 3A, a gap-fill layer 108' is formed. The gap-fill layer 108' may cover an upper portion of an upper structure 105. The gap-fill layer 108' may include a dielectric material, for example, silicon oxide. The gap-fill layer 108' may gap-fill a through-hole 107 without a void. The process of forming the gap-fill layer 108' may be substantially the same as that described above with reference to FIGS. 1A to 1D.

The gap-fill layer 108' may be planarized. The gap-fill layer 108' may be planarized so that a constant thickness remains on the upper portion of the upper structure 105. The planarization of the gap-fill layer 108' may be performed by a chemical mechanical polishing (CMP) process. Hereinafter, and as shown in FIG. 3A, the planarized gap-fill layer is denoted as reference numeral '108.'

The gap-fill layer 108 may cover the upper structure 105, and an upper surface of the gap-fill layer 108 may be planarized. The gap-fill layer 108 may include a sacrificial gap-fill layer 109 filling the through-hole 107. The gap-fill layer 108 may further include an upper gap-fill layer 121. The upper gap-fill layer 121 may be formed on the upper structure 105 and the sacrificial gap-fill layer 109. In an embodiment, the upper gap-fill layer 121 is what is left of the gap-fill layer 108' after planarization.

Figure 3B:
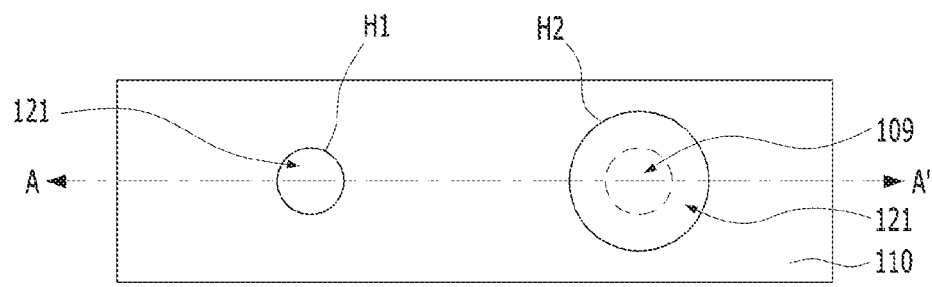
Figure 3B:
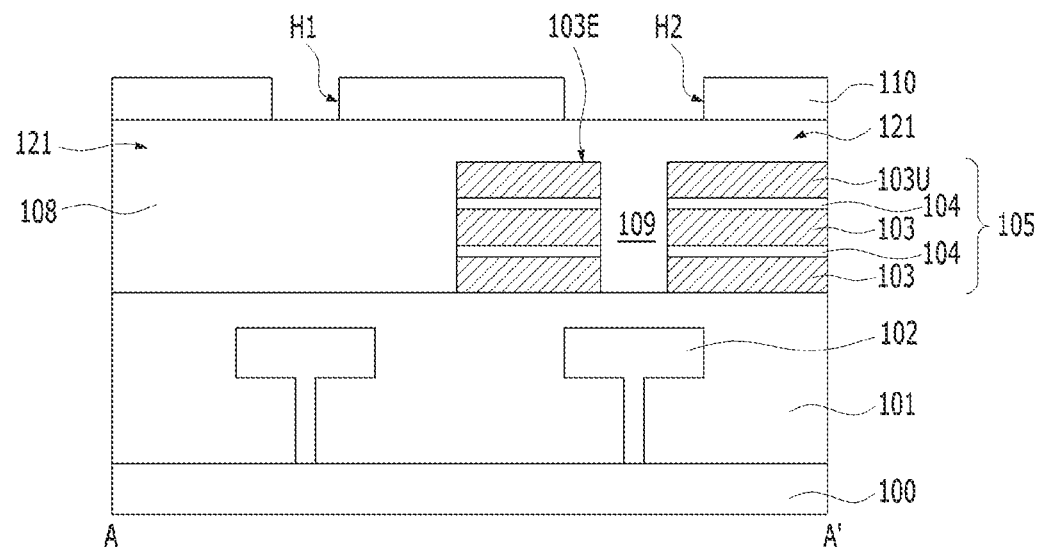

Referring to FIG. 3B, a second mask layer 110 is formed. The second mask layer 110 may include a hole type opening H1 and a self-aligned opening H2. The hole type opening H1 and the self-aligned opening H2 may expose an upper surface of the upper gap-fill layer 121. The self-aligned opening H2 may have a larger width than the hole type opening H1. The self-aligned opening H2 may have a larger width than the through hole 107.

Figure 3C:
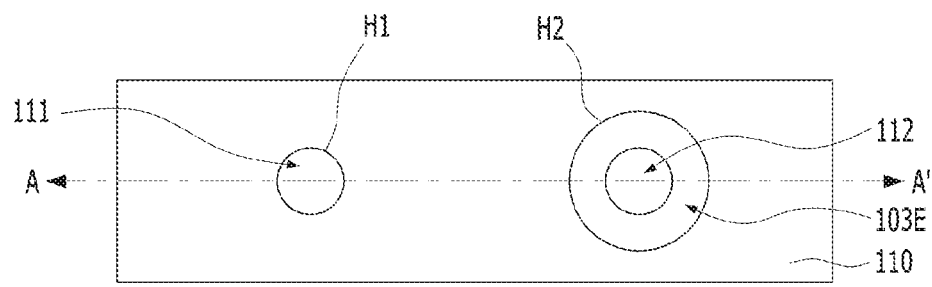
Figure 3C:
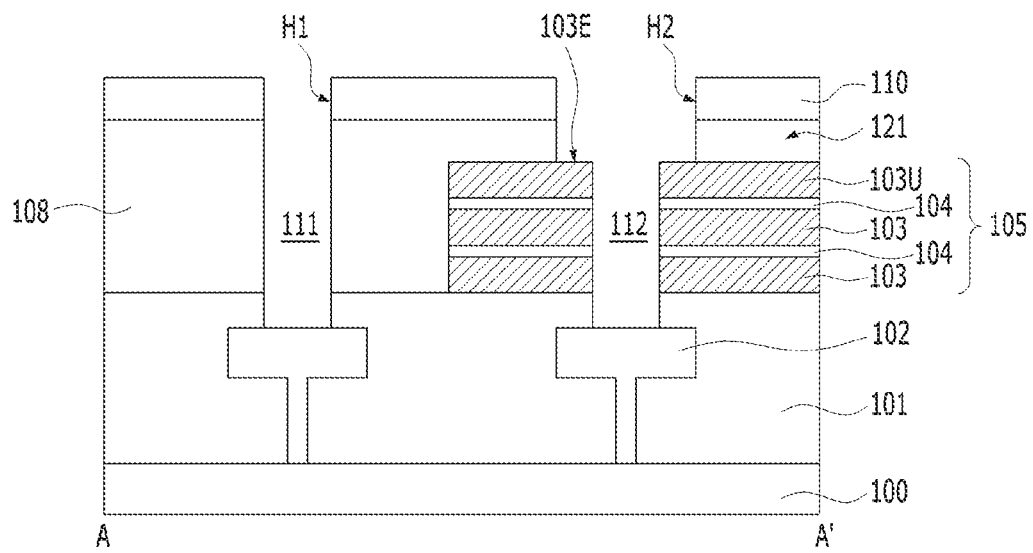

Referring to FIG. 3C, a portion of the gap-fill layer 108 exposed by the second mask layer 110 is etched. Accordingly, a first contact hole 111 and a second contact hole 112 are formed. The first contact hole 111 may be formed by etching portions of the upper gap-fill layer 121 and the gap-fill layer 108. The second contact hole 112 may be formed by etching a portion of the upper gap-fill layer 121 and the sacrificial gap-fill layer 109. The second contact hole 112 may have a shape of reopening the through-hole 107 of the upper structure 105.

The etch process for forming the first contact hole 111 may include etching the upper gap-fill layer 121 and the gap-fill layer 108 with the second mask layer 110 as an etch barrier through the hole type opening H1.

The etch process for forming the second contact hole 112 may include etching the upper gap-fill layer 121 through the self-aligned opening H2 with the second mask layer 110 used as an etch barrier, and etching the sacrificial gap-fill layer 109 through the self-aligned opening H2 with the second mask layer 110 and an uppermost polysilicon layer 103U used as etch barriers.

As described above, the first and second contact holes 111 and 112 may be formed simultaneously, and the gap-fill layer 108 and the sacrificial gap-fill layer 109 may be etched by the same etch gas at the same time. Accordingly, a mask layer for forming the first contact hole 111 and a separate mask layer for forming the second contact hole 112 are not needed. In other words, the second mask layer 110 alone may be used to form the first contact hole 111 and the second contact hole 112 simultaneously. When the gap-fill layer 108 and the sacrificial gap-fill layer 109 include silicon oxide, a silicon oxide etch gas may be used. Because the uppermost polysilicon layer 103U has a selectivity against silicon oxide etch gas, the sacrificial gap-fill layer 109 may be easily etched.

The uppermost polysilicon layer 103U may be used as an etch barrier or a hard mask when the sacrificial gap-fill layer 109 is etched. As above, the second contact hole 112 may be formed using a dual etch barrier of the second mask layer 110 and the uppermost polysilicon layer 103U. The first contact hole 111 may be formed using a single etch barrier of the second mask layer 110.

Subsequently, the first contact hole 111 and the second contact hole 112 may be extended downward to expose an upper surface of a lower wiring 102. To extend the first contact hole 111 and the second contact hole 112 downward, an upper portion of an inter-layer dielectric layer (ILD) 101 is etched. During the etch process for extending the second contact hole 112 downward, the uppermost polysilicon layer 103U and the second mask layer 110 may be used as a dual etch barrier.

The second contact hole 112 may be self-aligned with an edge 103E of the uppermost polysilicon layer 103U.

Figure 3D:
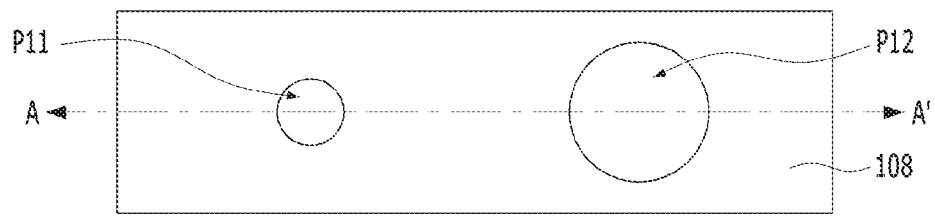
Figure 3D:
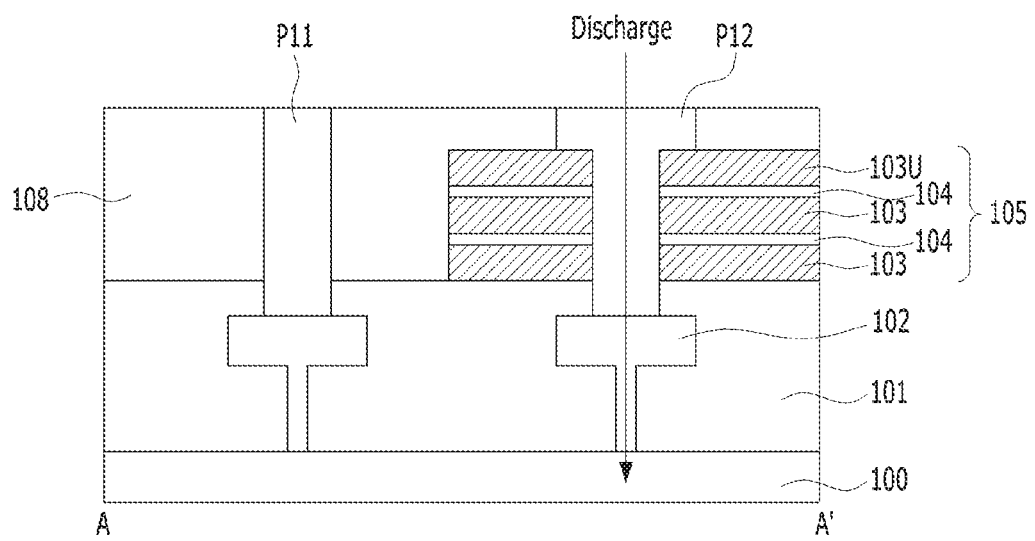

Referring to FIG. 3D, the second mask layer 110 is removed after etching to extend the first contact hole 111 and the second contact hole 112 downward to the upper surface of the lower wiring 102.

Subsequently, each of the first and second contact holes 111 and 112 may be filled with a conductive material. For example, the first and second contact holes 111 and 112 may be filled with a metal-based material, forming a first plug P11 and a second plug P12 in the first and second contact holes 111 and 112, respectively.

In accordance with embodiments described above, an etch target layer may be subsequently formed on the first plugs P1 (FIG. 1G) and P11 (FIG. 3D) and the second plugs P2 (FIG. 1G) and P12 (FIG. 3D), and then plasma-etched. When the plasma-etch process is performed, plasma charges concentrate so as to cause an arcing phenomenon. In accordance with embodiments of the present teachings, before the plasma-etch process is performed, the conductive second plugs P2 and P12 are formed so as to serve as a ground or a pathway to ground, thereby preventing or mitigating the arcing phenomenon. The conductive second plugs P2 and P12 may be referred to as "discharge contact plugs." For some embodiments, the plasma charges generated during the plasma-etch process are discharged to the substrate 100 through the conductive second plugs P2 and P12, as indicated by the discharge path illustrated in FIGS. 1G and 3D.

FIGS. 4A to 4M are cross-sectional views illustrating an example of a method for fabricating a vertical semiconductor device, in accordance with embodiments of the present teachings.

Figure 4A:
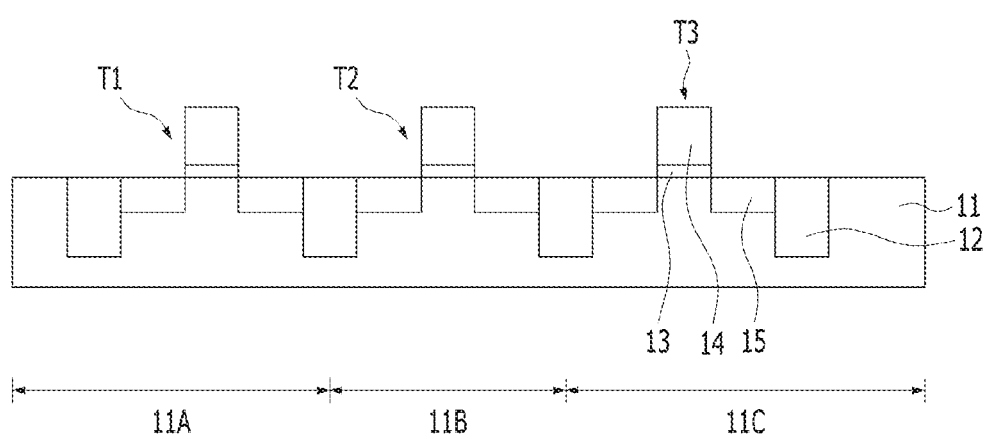
FIGS. 4A to 4M are cross-sectional views illustrating an example of a method for fabricating a vertical semiconductor device, in accordance with embodiments of the present disclosure.

Referring to FIG. 4A, a plurality of transistors T1, T2, and T3 are formed on a substrate 11. The transistors T1, T2, and T3 may be isolated from one another by an isolation layer 12. The isolation layer 12 may be formed by a shallow trench isolation (STI) process. For example, the isolation layer 12 may be formed by filling an isolation trench with a dielectric material. The isolation layer 12 may include silicon oxide, silicon nitride, or a combination thereof. The substrate 11 may include a first region 11A and a second region 11B. The first region 11A may be a main portion, and the second region 11B may be an edge portion. The first and second regions 11A and 11B may be a cell region, and the second region 11B may be an edge region of the cell region. The substrate 11 may further include a third region 11C, and the third region 11C may be a peripheral circuit region.

Each of the transistors T1, T2, and T3 may include a gate dielectric layer 13, a gate electrode 14, and a source/drain region 15. The gate dielectric layer 13 may include silicon oxide, silicon oxynitride, or a high-k material. The gate electrode 14 may include a silicon-containing material, a metal-containing material, or a combination thereof. The gate electrode 14 may include polysilicon, doped polysilicon, silicon germanium, doped silicon germanium, a metal, metal nitride, metal silicide, or any combinations thereof. For example, the gate electrode 14 may include a multi-layer structure in which the doped polysilicon and the metal are stacked on one another, and the doped polysilicon may be doped with an N-type impurity or a P-type impurity. The source/drain region 15 may include an impurity. For example, in case of an NMOS transistor, the source/drain region 15 may be doped with an N-type impurity. In case of a PMOS transistor, the source/drain region 15 may be doped with a P-type impurity. The source/drain region 15 may have a lightly doped drain (LDD) structure. Although not illustrated, a gate spacer may be further formed on a sidewall of the stack of the gate dielectric layer 13 and the gate electrode 14.

Figure 4B:
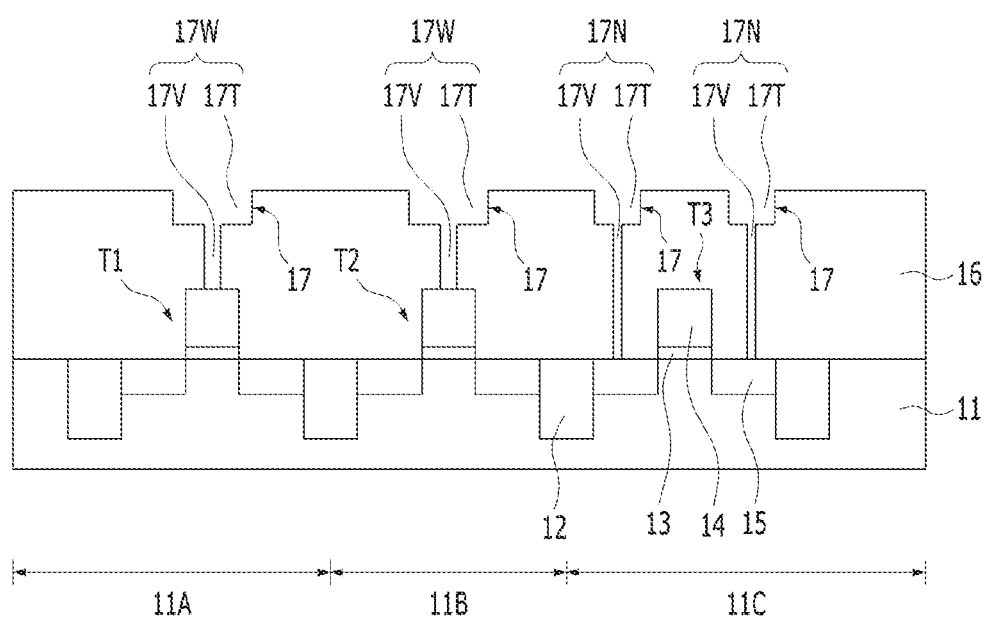

Referring to FIG. 4B, a first inter-layer dielectric layer (ILD) 16 is formed. The first ILD 16 may include oxide, nitride, or a combination thereof. The first ILD 16 may include silicon oxide. The first ILD 16 may include BPSG, SiO$_2$, a spin-on-dielectric (SOD) substance, a low-k material, or any combinations thereof. Although not illustrated, an etch stop layer may be formed over an entire surface of the substrate 11 including the transistors T1, T2, and T3, before the first ILD 16 is formed. The etch stop layer may include silicon nitride, silicon carbon nitride, silicon boron nitride, or any combination thereof.

A plurality of first openings 17W and 17N may be formed in the first ILD 16. The first openings 17W and 17N may have the same size or different sizes. The first openings 17W and 17N may include a wide opening 17W and a narrow opening 17N. The wide opening 17W may have a larger width than the narrow opening 17N. The wide opening 17W may expose an upper surface of the gate electrode 14, and the narrow opening 17N may expose an upper surface of the source/drain region 15. Each of the first openings 17W and 17N may include a via hole 17V and a trench 17T. The via hole 17V may refer to a lower region of each of the first openings 17W and 17N, and the trench 17T may refer to an upper region of each of the first openings 17W and 17N. The via hole 17V may expose the upper surfaces of the gate electrode 14 and source/drain region 15. From a top view, the via hole 17V may have a circular shape, and the trench 17T may have a linear shape extending in any direction. The via hole 17V and the trench 17T may be formed by a damascene process. The damascene process may be performed by any of a single damascene process, a dual damascene process, a via-first dual damascene process, and a trench-first dual damascene process. A diameter of the via hole 17V may be smaller than a width of the trench 17T. The via hole 17V of the wide opening 17W may have a larger diameter than the via hole 17V of the narrow opening 17N. The trench 17T of the wide opening 17W may have a larger width than the trench 17T of the narrow opening 17N.

For convenience of description, the first openings 17W and 17N are collectively denoted as 'first opening 17.'

Figure 4C:
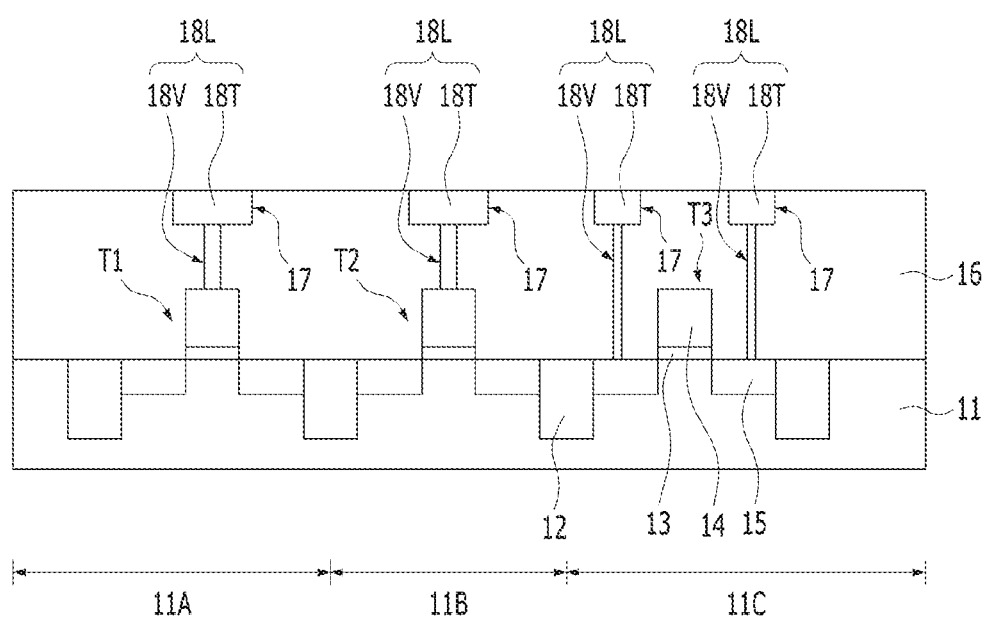

Referring to FIG. 4C, a plurality of first wiring structures 18L are formed in the first opening 17. In order to form the first wiring structures 18L, the first opening 17 may be gap-filled with a conductive material, and then a planarization process may be performed thereon. An upper surface of each first wiring structure 18L may be at the same level as an upper surface of the first ILD 16. The first wiring structure 18L may include a metal-based material. The first wiring structure 18L may include a metal, metal nitride, or a combination thereof. The first wiring structure 18L may include tungsten, aluminum, molybdenum, titanium nitride, tantalum nitride, tungsten silicide, titanium silicide, nickel silicide, or any combinations thereof. For example, the first wiring structure 18L may include a stack of titanium nitride and tungsten. The first wiring structure 18L may be formed through a process of thinly forming titanium nitride on the first opening 17, gap-filling the first opening 17 with tungsten, and planarizing the resultant structure. The first wiring structure 18L may include a via 18V and a conductive line 18T on the via 18V. A portion which fills the via hole (i.e., 17V of FIG. 4B) of the first opening 17 may be referred to as a "contact," a "plug," or the "via 18V." A portion which fills the trench (i.e., 17T of FIG. 4B) of the first opening 17 may be referred to as the "conductive line 18T." When the first wiring structure 18L is a metal-based material, the first wiring structure 18L may be referred to as a "first metal wiring structure." The plurality of first wiring structures 18L may be at the same level. In other words, the upper surfaces of the first wiring structures 18L may be at the same level.

Figure 4D:
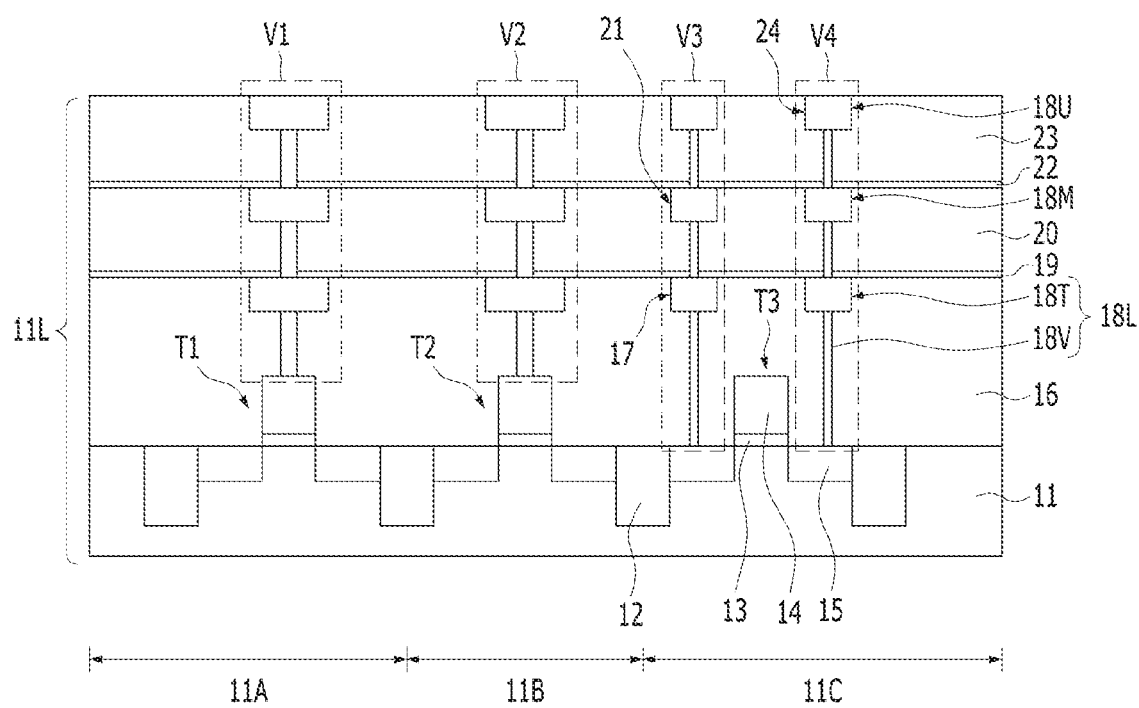

Referring to FIG. 4D, a second wiring structure 18M and a third wiring structure 18U are sequentially formed. The second and third wiring structures 18M and 18U may be formed in the same manner as the first wiring structure 18L by a damascene process. The second and third wiring structures 18M and 18U may include a metal-based material. Each of the second and third wiring structures 18M and 18U may include a via 18V and a conductive line 18T on the via 18V, like the first wiring structure 18L. The second and third wiring structures 18M and 18U may be referred to as a "second metal wiring structure" and a "third metal wiring structure," respectively.

The forming of the second wiring structure 18M may include forming a second opening 21, gap-filling the second opening 21 with a conductive material, and planarizing the conductive material. For example, the second opening may be formed through a process of forming a first etch stop layer 19 and a second ILD 20 on the first ILD 16 including the first wiring structures 18L, and exposing the upper surfaces of the first wiring structures 18L by etching the second ILD 20 and the first etch stop layer 19. After the second opening 21 is gap-filled with a metal-based material, the metal-based material may be planarized until a surface of the second ILD 20 is exposed. The second opening 21 may include a wide opening and a narrow opening, like the first opening 17.

The forming of the third wiring structure 18U may include forming a third opening 24, gap-filling the third opening 24 with a conductive material, and planarizing the conductive material. For example, the third opening 24 may be formed through a process of forming a second etch stop layer 22 and a third ILD 23 on the second ILD 20 including the second wiring structure 18M, and exposing an upper surface of the second wiring structure 18M by etching the third ILD 23 and the second etch stop layer 22. After the third opening 24 is gap-filled with a metal-based material, the metal-based material may be planarized until a surface of the third ILD 23 is exposed. The third opening 24 may include a wide opening and a narrow opening, like the first opening 17.

The first, second, and third wiring structures 18L, 18M, and 18U may be vertically connected to one another. Further, the first, second, and third wiring structures 18L, 18M, and 18U may be electrically connected to one another. The first wiring structure 18L may be referred to as a "lower wiring structure," the third wiring structure 18U may be referred to as an "upper wiring structure," and the second wiring structure 18M may be referred to as a "middle wiring structure."

Through the above-described series of processes, a lower structure 11L is formed. The lower structure 11L may include the substrate 11, the plurality of transistors T1, T2, and T3, and the first to third wiring structures 18L, 18M, and 18U. The lower structure 11L may further include the first ILD 16, the first etch stop layer 19, the second ILD 20, the second etch stop layer 22, and the third ILD 23. The lower structure 11L may include the first to third openings 17, 21, and 24 vertically connected to one another. The first to third openings 17, 21, and 24 may be filled with the first to third wiring structures 18L, 18M, and 18U, respectively.

A stack of the first to third wiring structures 18L, 18M, and 18U may define a plurality of vertical interconnections. The vertical interconnections may refer to multi-layered metal wirings or multi-layer level metal wirings. The vertical interconnections may include first to fourth vertical interconnections V1, V2, V3, and V4. The first and second vertical interconnections V1 and V2 may be connected to the gate electrode 14, and the third and fourth vertical interconnections V3 and V4 may be connected to the source/drain region 15. The first to fourth vertical interconnections V1, V2, V3, and V4 adjacent horizontally to the upper surface of the substrate 11 may be spaced apart from one another.

The vertical interconnections V1, V2, V3, and V4 may be abbreviated as "lower metal wirings."

Figure 4E:
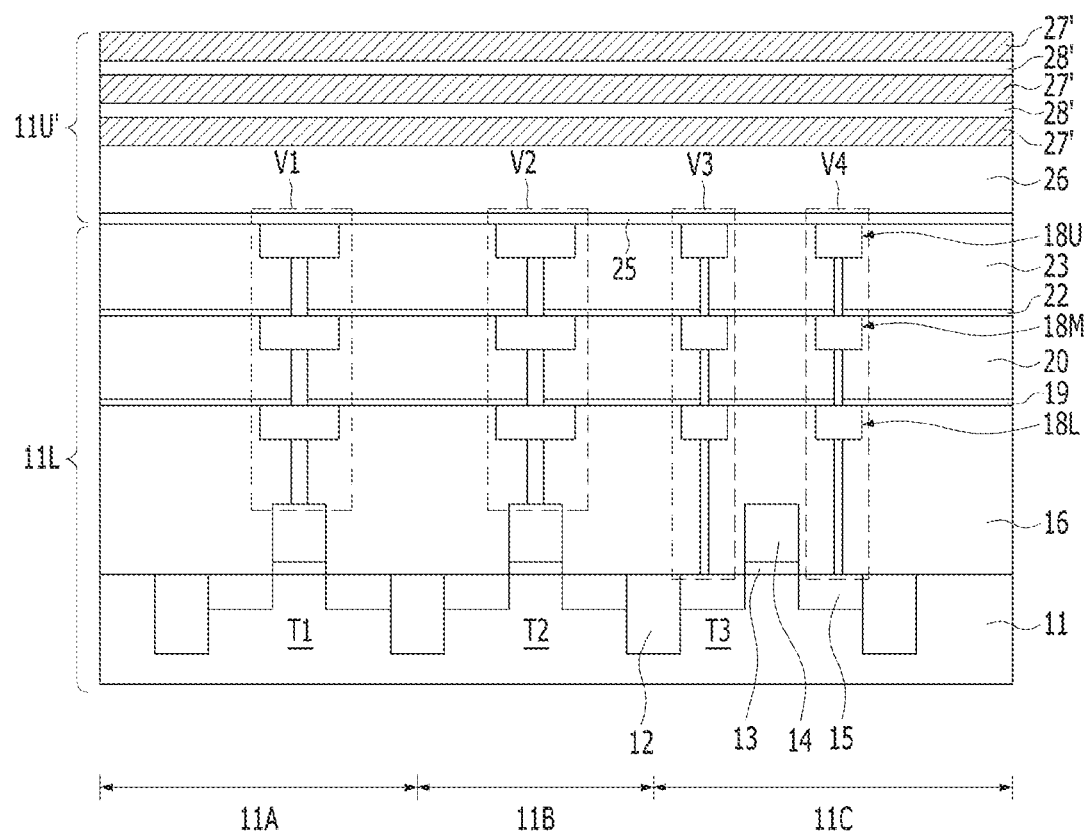

Referring to FIG. 4E, an upper stack structure 11U' is formed. The upper stack structure 11U' may include a plurality of dielectric layers and a plurality of conductive layers. The upper stack structure 11U' may include silicon nitride, silicon oxide, or polysilicon. In addition, the upper stack structure 11U' may be a multi-layer structure including silicon nitride, silicon oxide, and polysilicon.

The upper stack structure 11U' may include an upper etch stop layer 25, a buffer layer 26, and an alternating stack 27'/28'. The alternating stack 27'/28' may include a plurality of polysilicon layers 27' and a plurality of dielectric layers 28', which are alternately stacked on one another. The lowermost and uppermost layers of the alternating stack 27'/28' may be polysilicon layers 27'. The polysilicon layers 27' may have a larger thickness than the dielectric layers 28'. The upper etch stop layer 25 may be formed of the same material as the first and second etch stop layers 19 and 22.

The upper etch stop layer 25 may include silicon nitride. The upper etch stop layer 25 may cover the upper surfaces of the third wiring structures 18U and the third ILD 23. The buffer layer 26 may include a dielectric material, for example, silicon oxide. The dielectric layers 28' of the alternating stack 27'/28' may include silicon oxide.

Figure 4F:
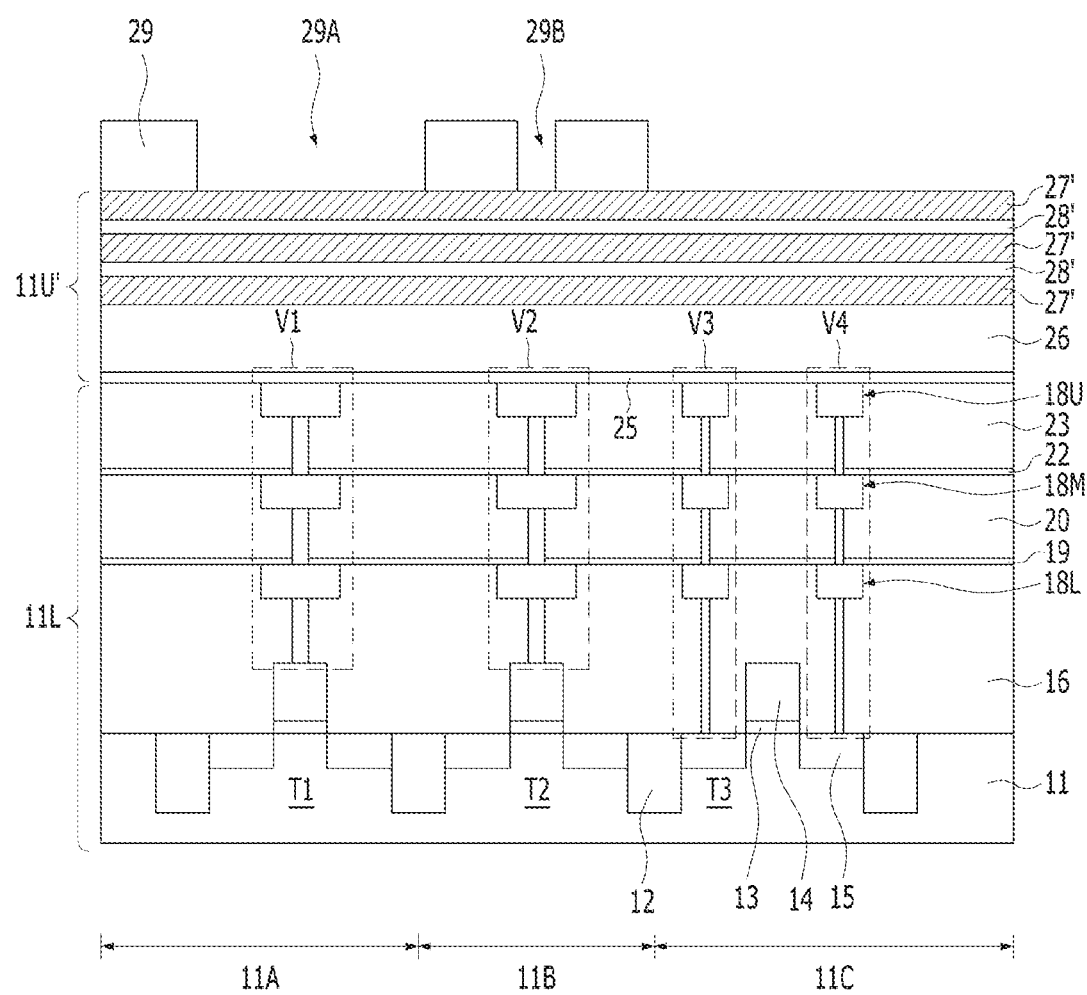

Referring to FIG. 4F, a first mask layer 29 is formed. The first mask layer 29 may include a plurality of openings 29A and 29B. The openings 29A and 29B may include a first opening 29A and a second opening 29B. The first opening 29A may have a larger width than the second opening 29B. The first and second openings 29A and 29B may partially expose the top surface of the upper stack structure 11U' underneath. The first mask layer 29 may be referred to as a "cut mask layer."

Figure 4G:
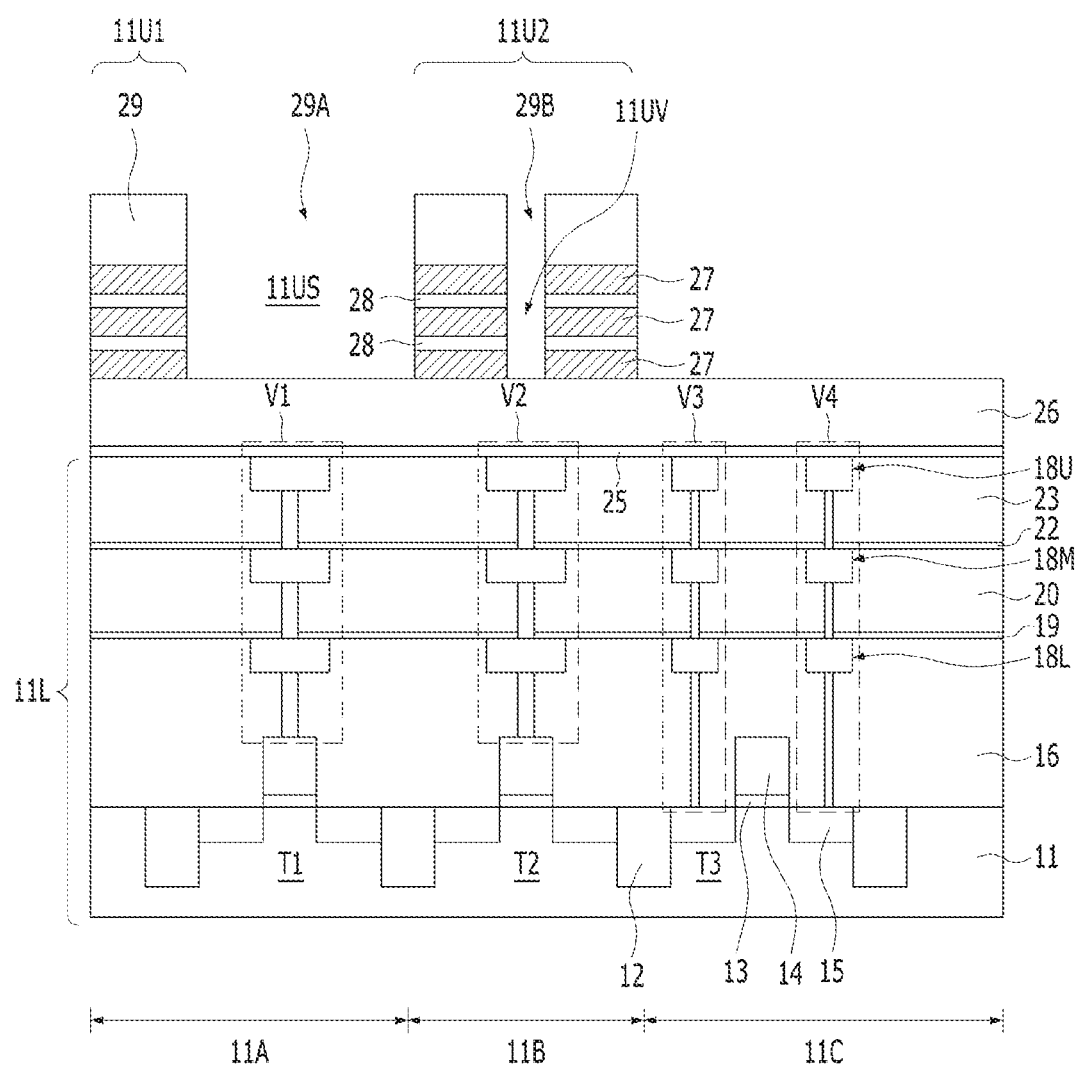

Referring to FIG. 4G, a plurality of upper structures 11U1 and 11U2 are formed. In order to form the upper structures 11U1 and 11U2, the upper stack structure 11U' may be etched with the first mask layer 29 used as an etch barrier. The upper structures 11U1 and 11U2 may include a first upper structure 11U1 and a second upper structure 11U2. The first and second upper structures 11U1 and 11U2 may be spaced apart from each other. The first upper structure 11U1 may be disposed on the first region 11A, and the second upper structure 11U2 may be disposed on the second region 11B. The first and second upper structures 11U1 and 11U2 may have different widths. Each of the first and second upper structures 11U1 and 11U2 may include alternating stack patterns 27/28. The alternating stack patterns 27/28 may have a structure in which a plurality of polysilicon layer patterns 27 and a plurality of dielectric layer patterns 28 are alternately stacked on one another. The lowermost and uppermost layers of the alternating stack patterns 27/28 may be polysilicon layer patterns 27.

The first upper structure 11U1 might not overlap the first vertical connection structure V1. The second upper structure 11U2 may overlap the second vertical connection structure V2. The first and second upper structures 11U1 and 11U2 might not be disposed over the third and fourth vertical convection structures V3 and V4.

An isolation portion 11US between the first upper structure 11U1 and the second upper structure 11U2 may be defined by the first opening 29A of the first mask layer 29. The isolation portion 11US may be referred to as a "slit." As a portion of the second upper structure 11U2 is etched through the second opening 29B of the first mask layer 29, a through-hole 11UV may be formed to penetrate the second upper structure 11U2. A lower end of the through-hole 11UV may expose an upper surface of the buffer layer 26.

In accordance with embodiments described above, the isolation portion 11US and the through-hole 11UV may be formed simultaneously. This is possible by defining the second opening 29B, located where the through-hole 11UV is to be formed, during the formation of the first mask layer 29.

Figure 4H:
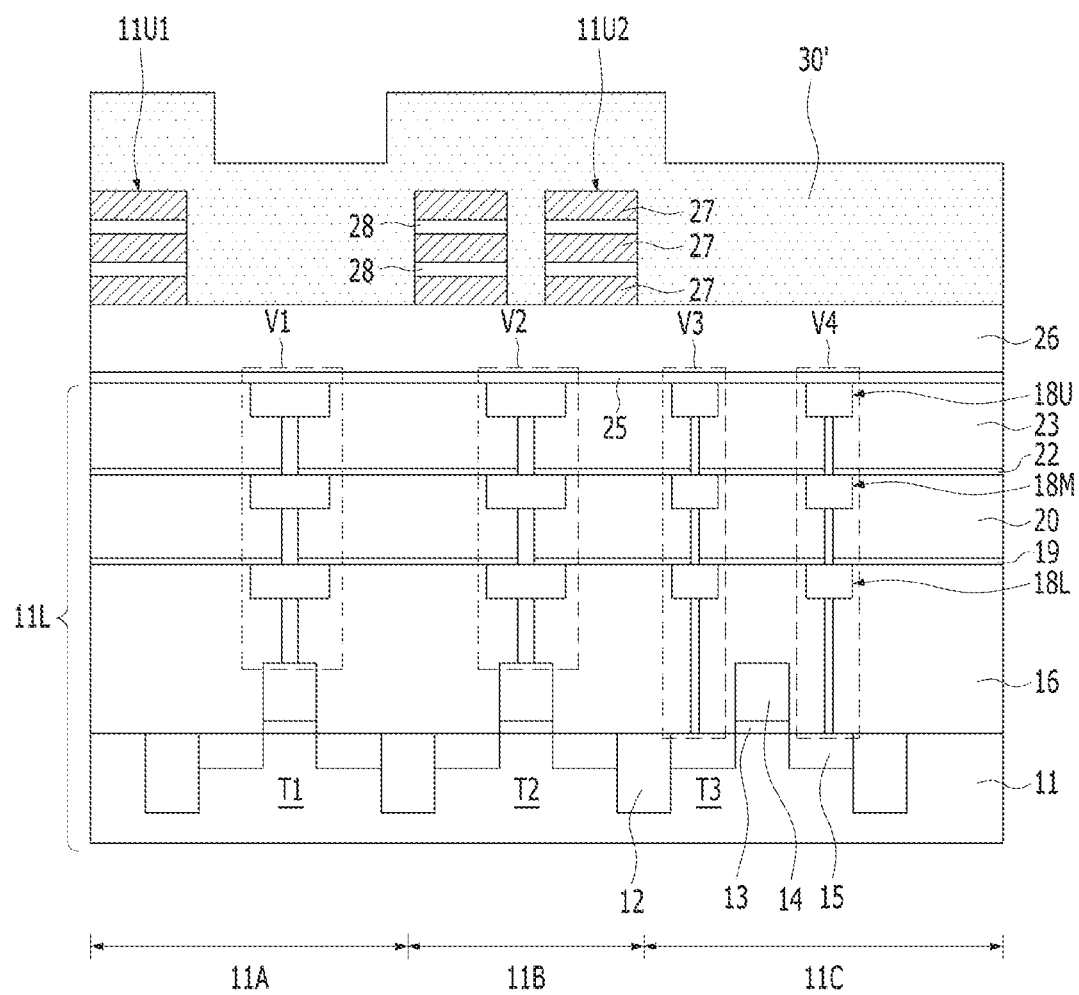

Referring to FIG. 4H, a gap-fill layer 30' is formed after the first mask layer 29 is removed. The gap-fill layer 30' may cover upper portions of the first and second upper structures 11U1 and 11U2. The gap-fill layer 30' may include a dielectric material, for example, silicon oxide. The gap-fill layer 30' may gap-fill the isolation portion 11US and the through-hole 11UV without a void.

Figure 4I:
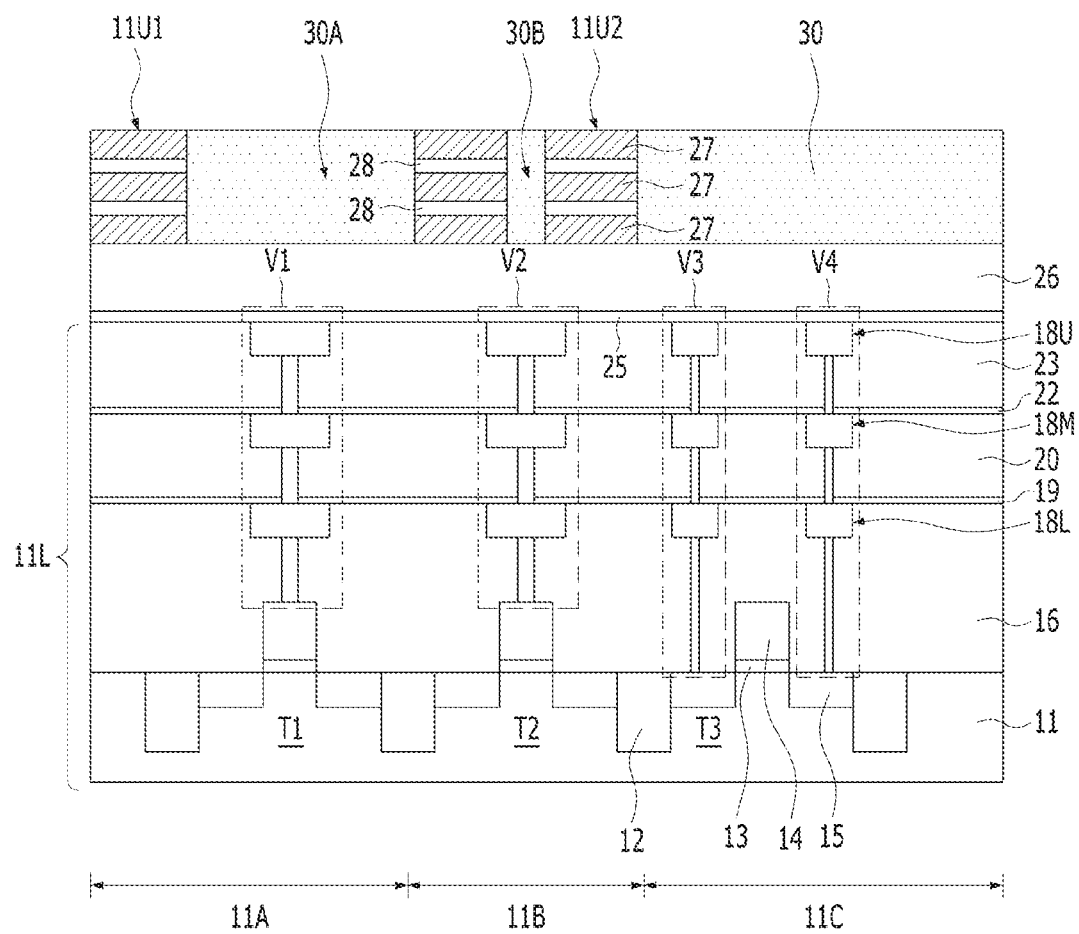

Referring to FIG. 4I, the gap-fill layer 30' is planarized. The gap-fill layer 30' may be planarized until upper surfaces of the first and second upper structures 11U1 and 11U2 are exposed. The planarization of the gap-fill layer 30' may be performed by a CMP process. Hereinafter, the planarized gap-fill layer is denoted as reference numeral '30.'

An upper surface of the gap-fill layer 30 may be at the same level as the upper surfaces of the first and second upper structures 11U1 and 11U2. In other words, there may be no level difference among the upper surfaces of the gap-fill layer 30, the first upper structure 11U1, and the second upper structure 11U2.

The gap-fill layer 30 may include a first gap-fill layer 30A filling the isolation portion 11US and a second gap-fill layer 30B filling the through-hole 11UV. The first gap-fill layer 30A may have a larger width than the second gap-fill layer 30B. The second gap-fill layer 30B may be referred to as a "sacrificial gap-fill layer."

Figure 4J:
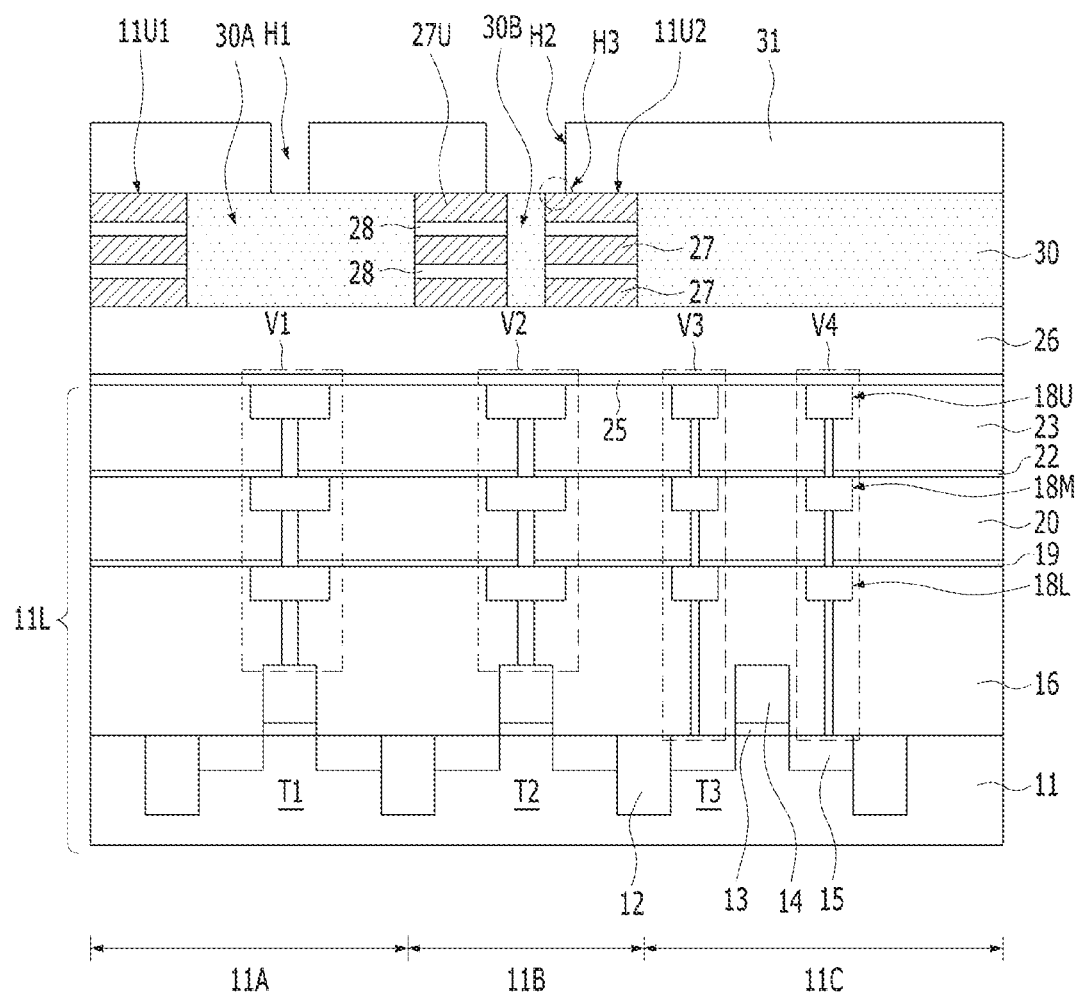

Referring to FIG. 4J, a second mask layer 31 is formed. The second mask layer 31 may include a hole type opening H1 and a self-aligned opening H2. The hole type opening H1 may expose an upper surface of the first gap-fill layer 30A. The self-aligned opening H2 may expose an upper surface of the second gap-fill layer 30B. The self-aligned opening H2 may have a larger width than the hole type opening H1. The self-aligned opening H2 may have a larger width than the second opening 29B. The self-aligned opening H2 may expose the second gap-fill layer 30B and a portion (refer to reference numeral H3) of the uppermost polysilicon layer 27 adjacent to the second gap-fill layer 30B. Hereinafter, the uppermost polysilicon layer 27 is denoted by the reference numeral '27U.'

Figure 4K:
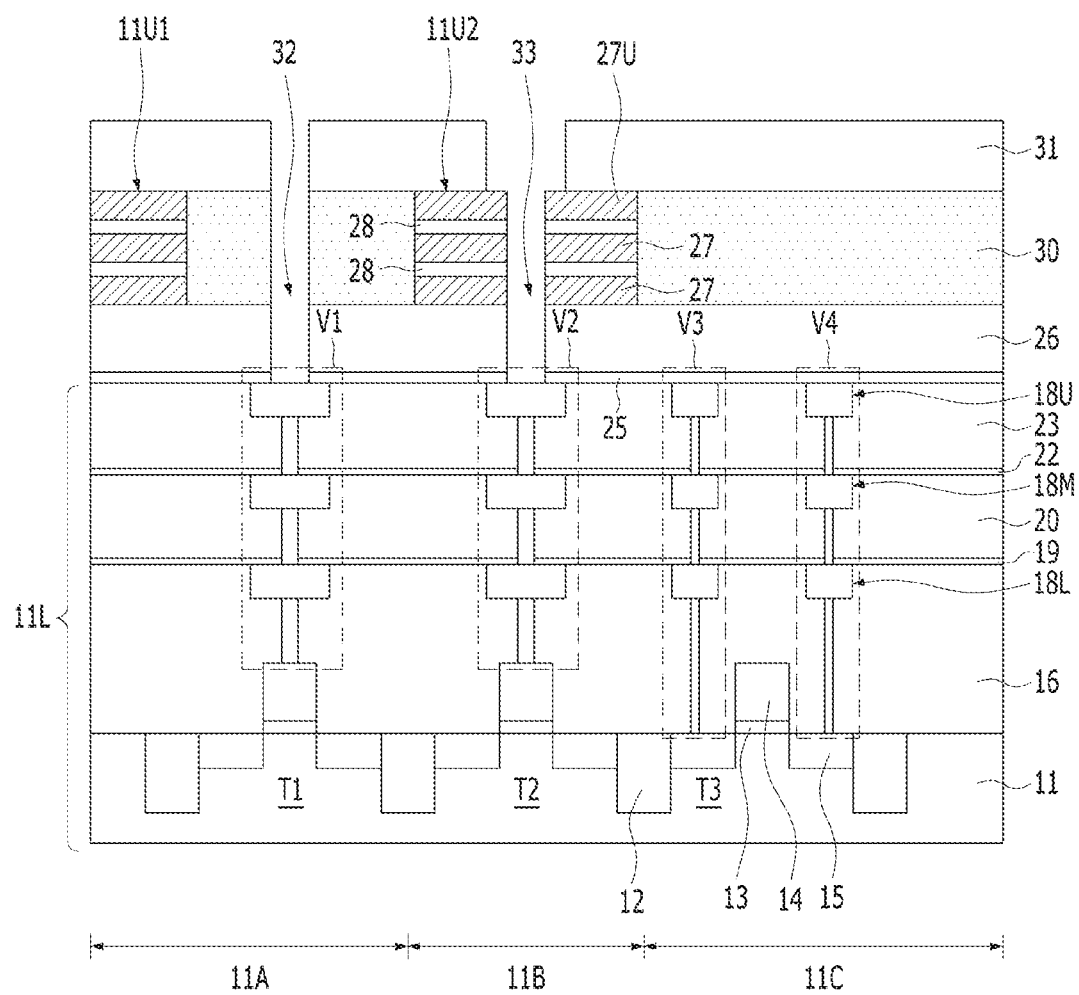

Referring to FIG. 4K, a portion of the gap-fill layer 30 exposed by the second mask layer 31 is etched. Accordingly, a first contact hole 32 and a second contact hole 33 may be formed. The first contact hole 32 may be formed by etching a portion of the first gap-fill layer 30A. The second contact hole 33 may be formed by fully etching the second gap-fill layer 30B. The second contact hole 33 may have a shape of the reopened through-hole 11UV of the second upper structure 11U2. The second mask layer 31 and the uppermost polysilicon layer 27U may be used as etch barriers in order to etch the second gap-fill layer 30B. The second mask layer 31 may be used as an etch barrier in order to etch the first gap-fill layer 30A. The etch process of the second gap-fill layer 30B may be performed while self-aligned with an edge of the uppermost polysilicon layer 27U through the self-aligned opening H2.

As described above, the first and second contact holes 32 and 33 may be formed simultaneously, and the first and second gap-fill layers 30A and 30B may be etched by the same etch gas at the same time. Accordingly, it is unnecessary to use a mask layer for forming the first contact hole 32 and a separate mask layer for separately forming the second contact hole 33. In other words, the second mask layer 31 alone may be used to form the first and second contact holes 32 and 33 simultaneously. When the first and second gap-fill layers 30A and 30B include silicon oxide, a silicon oxide etch gas may be used. Because the uppermost polysilicon layer 27U has a selectivity against silicon oxide etch gas, the second gap-fill layer 30B may be easily etched.

The uppermost polysilicon layer 27U may be used as an etch barrier or a hard mask when the second gap-fill layer 30B is etched. As above, the second contact hole 33 may be formed using a dual etch barrier of the second mask layer 31 and the uppermost polysilicon layer 27U. The first contact hole 32 may be formed using a single etch barrier of the second mask layer 31.

Subsequently, the first contact hole 32 may be extended downwardly to expose an upper surface of the first vertical connection structure, and the second contact hole 33 may be extended downward to expose an upper surface of the second vertical connection structure. In order to extend the first and second contact holes 32 and 33 downward, the buffer layer 26 and the upper etch stop layer 25 may be etched. During the etch process for extending the second contact hole 33 downward, the uppermost polysilicon layer 27U and the second mask layer 31 may be used as a dual etch barrier.

Figure 4L:
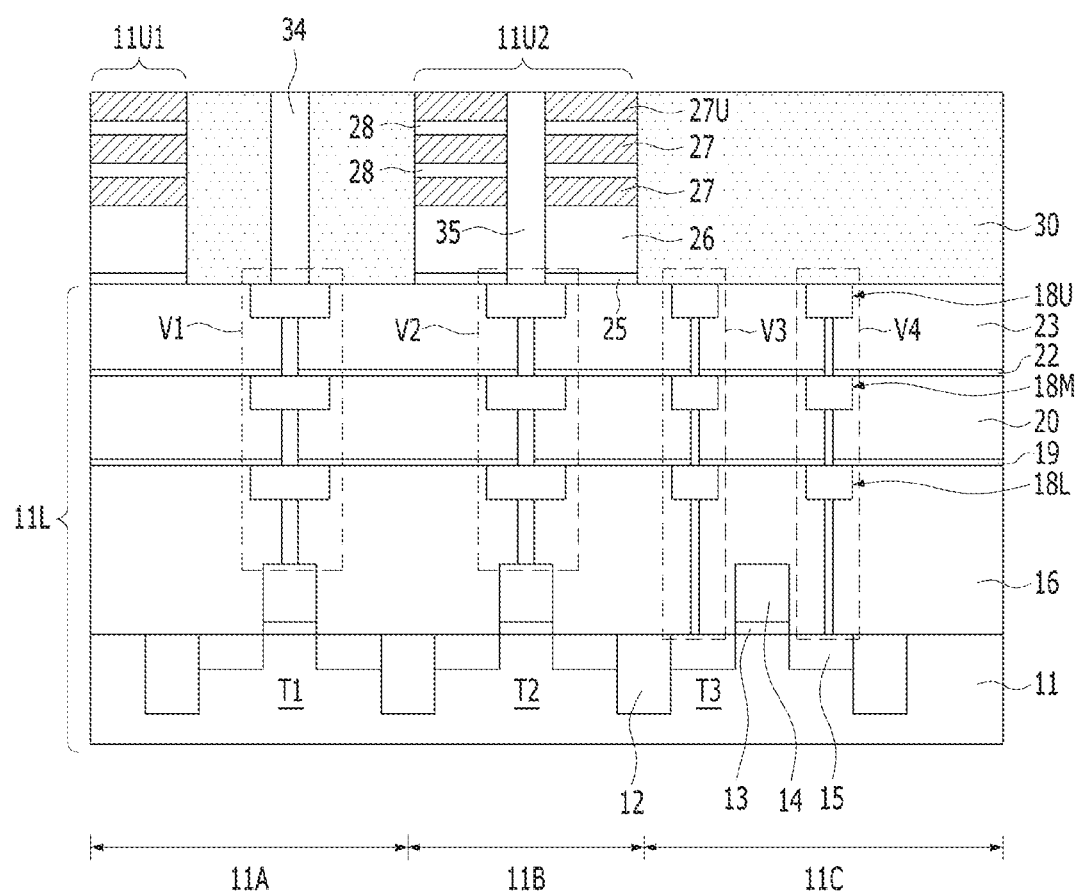

Referring to FIG. 4L, the second mask layer 31 is removed.

Subsequently, each of the first and second contact holes 32 and 33 may be filled with an electrically conductive material. For example, the first and second contact holes 32 and 33 may be filled with a metal-based material, and a conductive first plug 34 and a conductive second plug 35 may be formed in the first and second contact holes 32 and 33, respectively. The first and second plugs 34 and 35 may be formed on the first and second vertical connection structures V1 and V2, respectively. The first and second vertical connection structures V1 and V2 may be portions of the lower metal wirings, and the first and second plugs 34 and 35 may be referred to as "upper metal wirings."

Figure 4M:
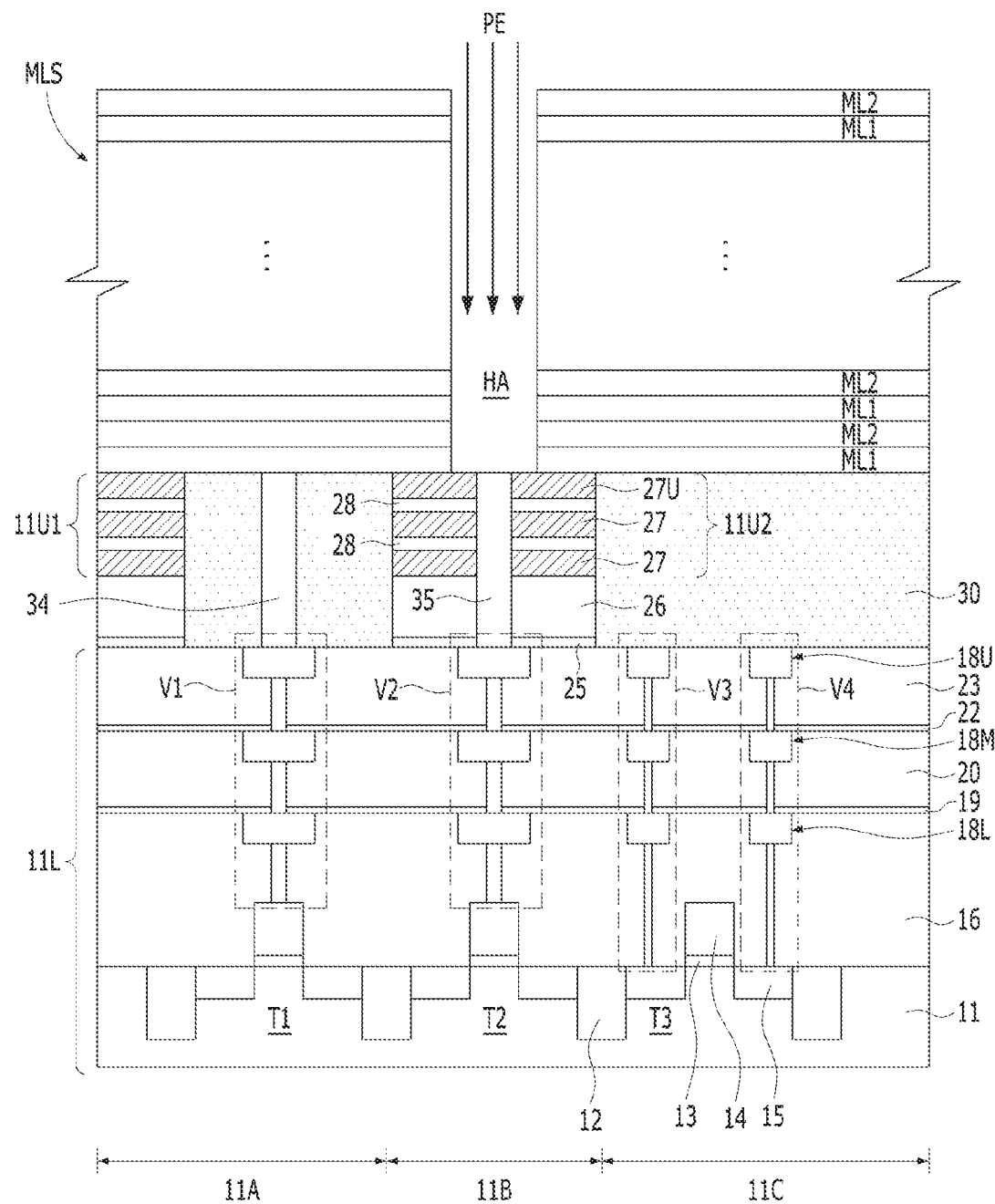

Referring to FIG. 4M, a multi-layer layered stack MLS is formed on the first and second upper structures 11U1 and 11U2 and the gap-fill layer 30, after the second mask layer 31 is removed. The multi-layer layered stack MLS may include a plurality of first etch target layers ML1 and a plurality of second etch target layers ML2, which are alternately stacked on one another.

A plasma-etch process PE may be performed on the multi-layer layered stack MLS. An opening HA having a high aspect ratio may be formed by the plasma-etch process PE.

When the plasma-etch process PE is performed, plasma charges may be concentrated, resulting in an arcing phenomenon. In accordance with some embodiments of the present teachings, as the second conductive plug 35 is formed before the plasma-etch process PE is performed on the multi-layer layered stack MLS, the second plug 35 may serve as a ground or a pathway to ground. Accordingly, the arcing phenomenon may be prevented or mitigated by the second plug 35.

The second plug 35 may be referred to as a "discharge contact (DDC) plug." When the second plug 35 includes a metal material, the second plug 35 may be referred to as a "discharge metal contact plug."

With the second plug 35 formed as described above, the opening HA having a high aspect ratio may be stably formed with the arcing phenomenon stopped or reduced during the plasma-etch process PE.

FIGS. 5A to 5D are cross-sectional views illustrating another example of a method for fabricating a vertical semiconductor device, in accordance with embodiments of the present teachings.

Figure 5A:
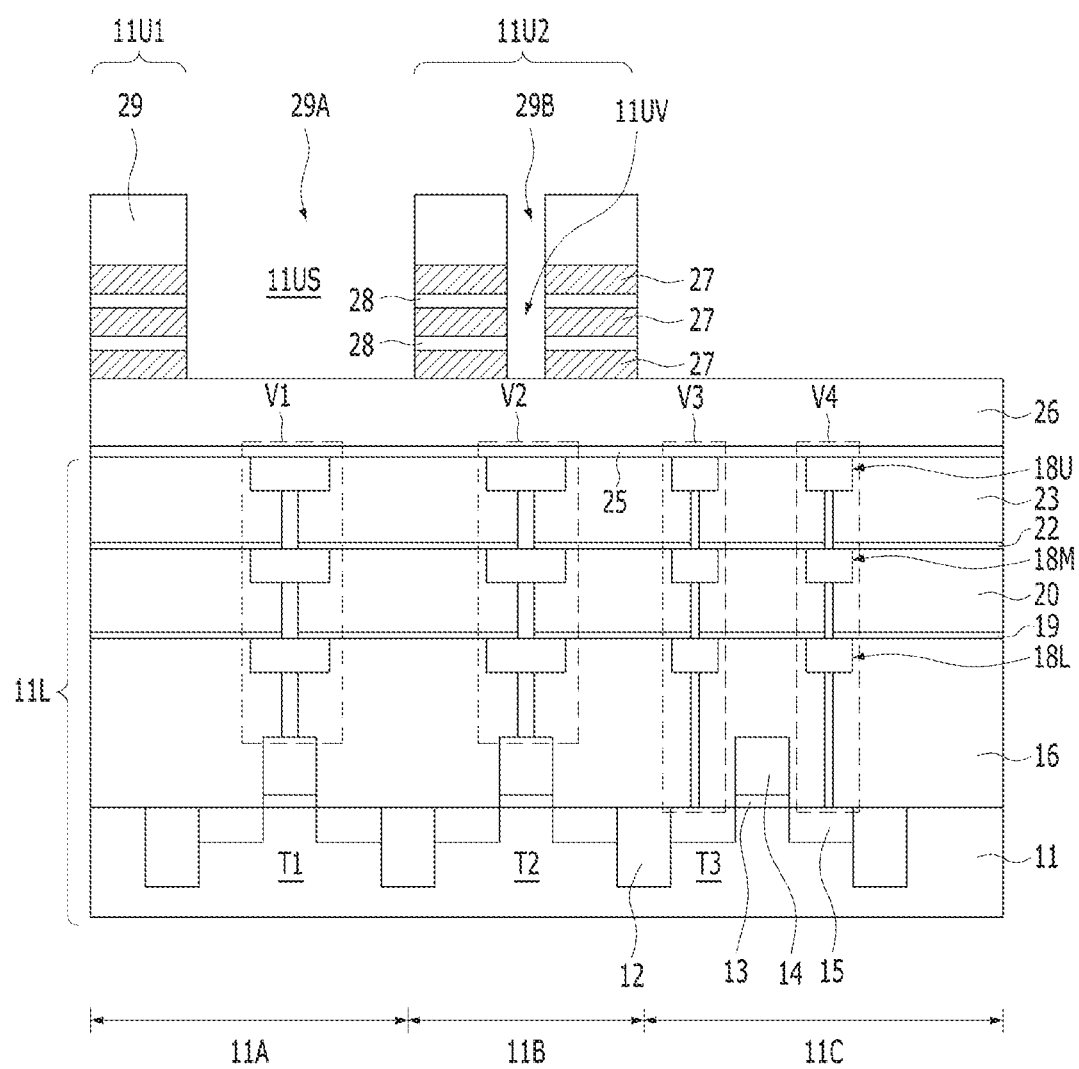
FIGS. 5A to 5D are cross-sectional views illustrating another example of a method for fabricating a vertical semiconductor device, in accordance with embodiments of the present disclosure.

Referring to FIG. 5A, an isolation portion 11US and a through-hole 11US are formed. A series of processes for forming the isolation portion 11US and the through-hole 11US may be the same as the processes illustrated with reference to FIGS. 4A to 4G. A first upper structure 11U1 and a second upper structure 11U2 may be isolated from each other by the isolation portion 11US. The second upper structure 11U2 may be penetrated by the through-hole 11UV.

A method for forming the first and second upper structures 11U1 and 11U2 on a substrate 11 may be performed in the same manner as the method described with reference to FIGS. 4A to 4G.

Figure 5B:
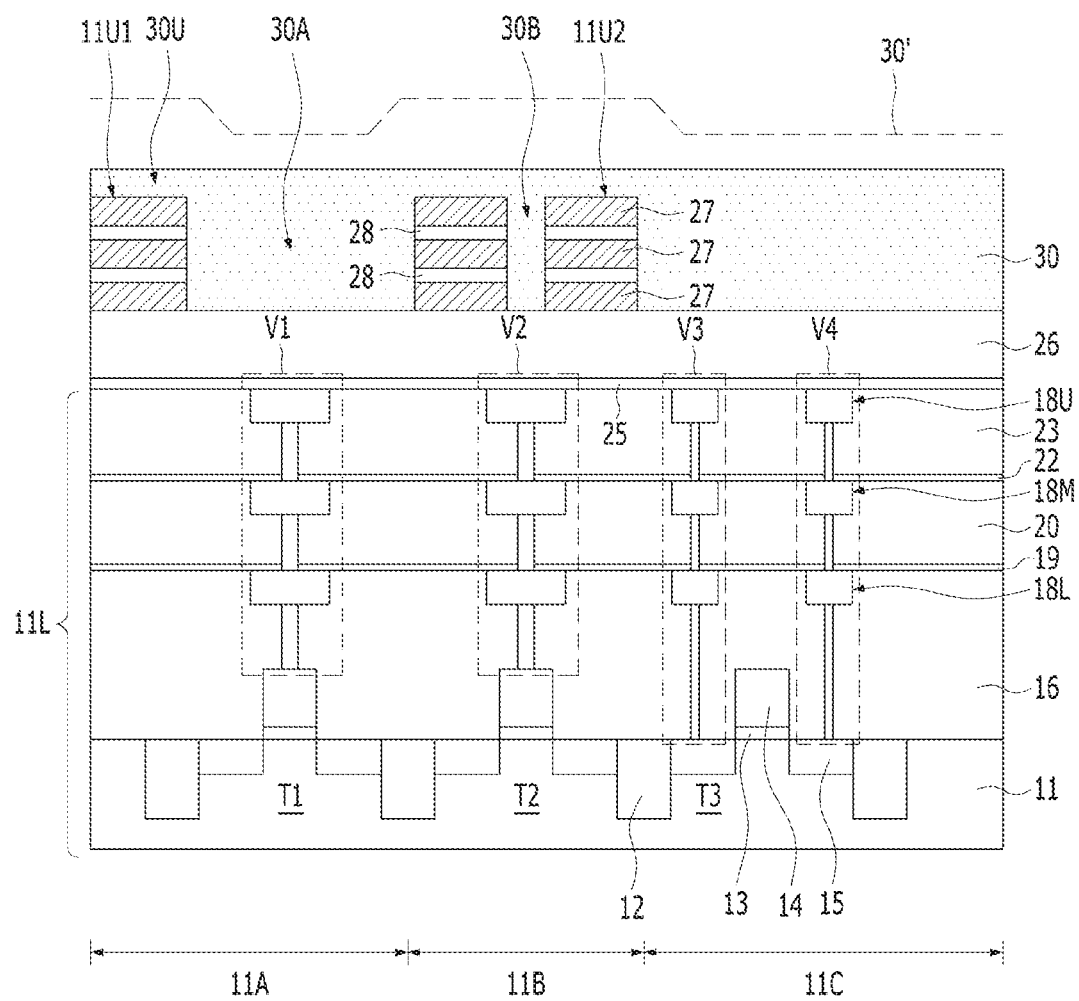

Referring to FIG. 5B, a gap-fill layer 30' is formed. The gap-fill layer 30' may cover upper portions of the first and second structures 11U1 and 11U2. The gap-fill layer 30' may include a dielectric material, for example, silicon oxide. The gap-fill layer 30' may gap-fill the isolation portion 11US and the through-hole 11UV without a void.

The gap-fill layer 30' may be planarized. The gap-fill layer 30' may be planarized so that a constant thickness remains on the upper portions of the first and second upper structures 11U1 and 11U2. The planarization of the gap-fill layer 30' may be performed by a chemical mechanical polishing (CMP) process. Hereinafter, the planarized gap-fill layer is denoted by reference numeral '30.'

The gap-fill layer 30 may cover the first and second upper structures 11U1 and 11U2, and have a planarized upper surface. The gap-fill layer 30 may include a first gap-fill layer 30A filling the isolation portion 11US and a second gap-fill layer 30B filling the through-hole 11UV. The first gap-fill layer 30A may have a larger width than the second gap-fill layer 30B. The gap-fill layer 30 may further include an upper gap-fill layer 30U. The upper gap-fill layer 30U may be formed on the first and second gap-fill layers 30A and 30B.

Figure 5C:
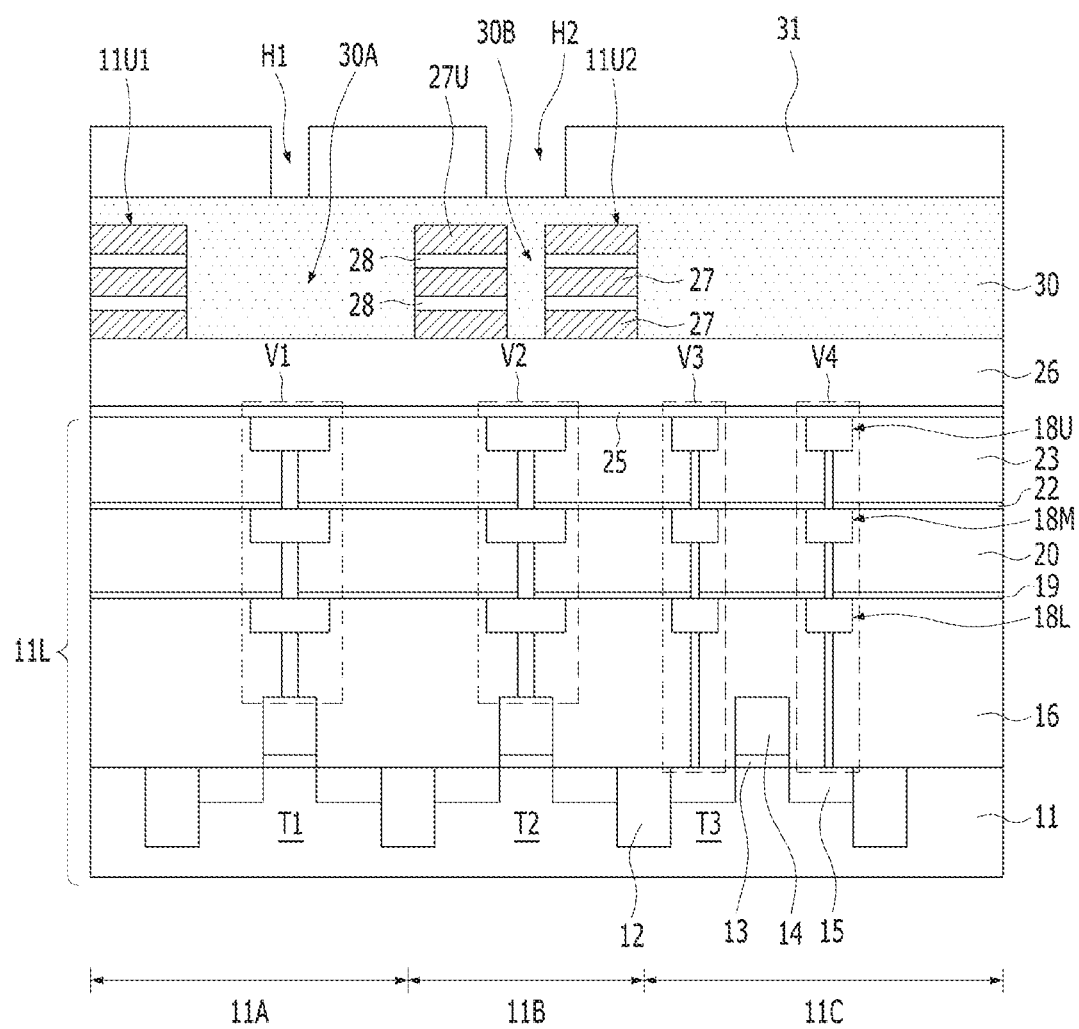

Referring to FIG. 5C, a second mask layer 31 is formed. The second mask layer 31 may include a plurality of hole type openings H1 and H2. The first hole type opening H1 may expose an upper surface of the upper gap-fill layer 30U, and the second hole type opening H2 may expose the upper surface of the upper gap-fill layer 30U. The second hole type opening H2 may have a larger width than the first hole type opening H1. The second hole type opening H2 may have a larger width than the opening 29B shown in FIG. A. The second hole type opening H2 is also referred to as a self-aligned opening.

Figure 5D:
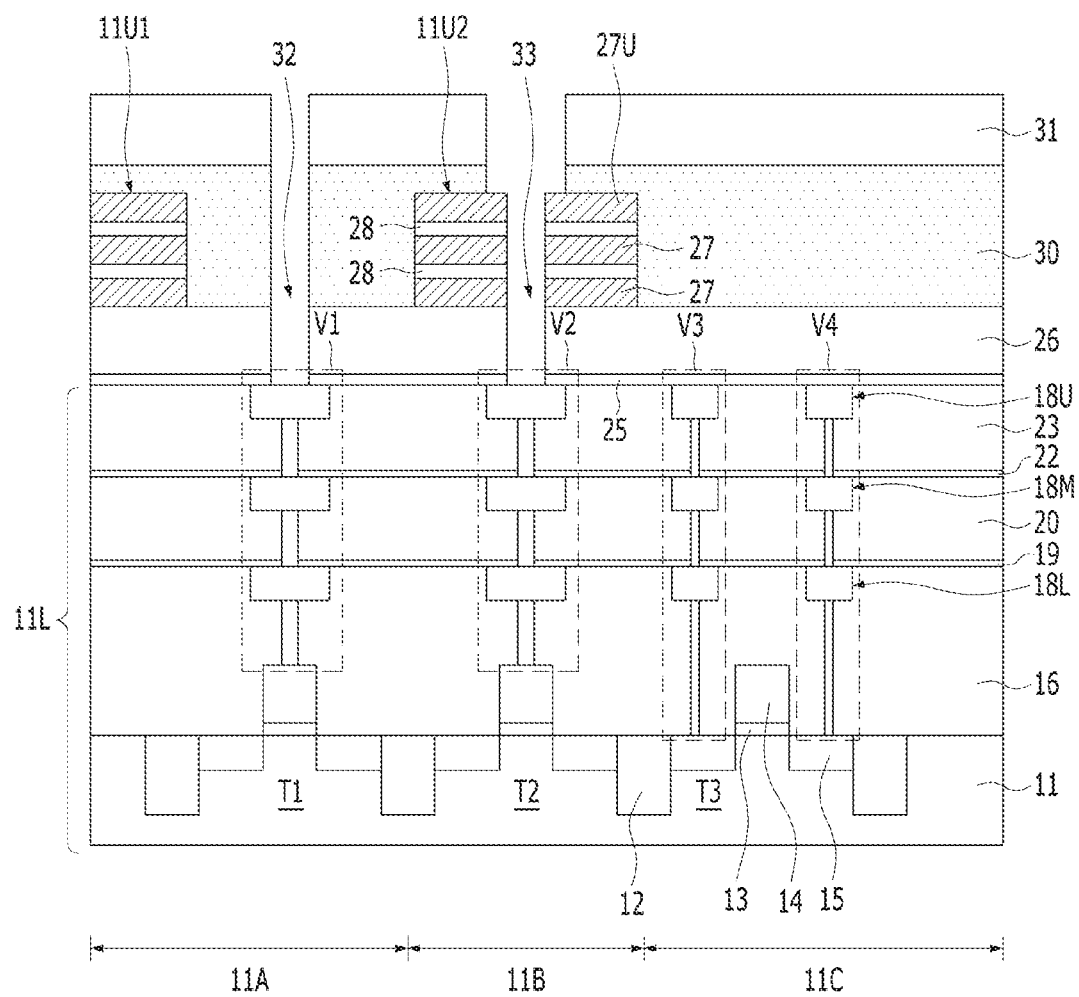

Referring to FIG. 5D, portions of the gap-fill layer 30 exposed by the second mask layer 31 may be etched. Accordingly, a first contact hole 32 and a second contact hole 33 may be formed. The first contact hole 32 may be formed by etching portions of the upper gap-fill layer 30U and first gap-fill layer 30A. The second contact hole 33 may be formed by etching a portion of the upper gap-fill layer 30U and the second gap-gill layer 30B. The second contact hole 33 may have a shape of the reopened through-hole 11UV of the second upper structure 11U2. In order to etch the second gap-fill layer 30B, the second mask layer 31 and an uppermost polysilicon layer 27U may be used as etch barriers. In order to etch the first gap-fill layer 30A, the second mask layer 31 may be used as an etch barrier. The second gap-fill layer 30B may be etched and self-aligned with the uppermost polysilicon layer 27U.

As described above, the first and second contact holes 32 and 33 may be formed simultaneously, and the first and second gap-fill layers 30A and 30B may be etched by the same etch gas at the same time. Accordingly, it is unnecessary to use a mask layer for forming the first contact hole 32 and a separate mask layer for separately forming the second contact hole 33. In other words, the second mask layer 31 alone may be used to form the first and second contact holes 32 and 33 simultaneously. When the first and second gap-fill layers 30A and 30B include silicon oxide, a silicon oxide etch gas may be used. Because the uppermost polysilicon layer 27U has a selectivity against silicon oxide etch gas, the second gap-fill layer 30B may be easily etched.

The uppermost polysilicon layer 27U may be used as an etch barrier or a hard mask when the second gap-fill layer 30B is etched. As above, the second contact hole 33 may be formed using a dual etch barrier of the second mask layer 31 and the uppermost polysilicon layer 27U. The first contact hole 32 may be formed using a single etch barrier of the second mask layer 31.

Subsequently, the first contact hole 32 may be extended downward to expose an upper surface of a first vertical connection structure V1, and the second contact hole 33 may be extended downward to expose an upper surface of a second vertical connection structure V2. In order to extend the first and second contact holes 32 and 33 downward, a buffer layer 26 and an upper etch stop layer 25 is etched. During an etch process for extending the second contact hole 33 downward, the uppermost polysilicon layer 27U and the second mask layer 31 may be used as a dual etch barrier.

A method for fabricating a semiconductor device in accordance with the present disclosure may include forming a vertical connection structure on a substrate, forming a discharge structure on the vertical connection structure, forming a multi-layer layered stack on the discharge structure, and performing a plasma etch process on the multi-layer layered stack to form an opening exposing the discharge structure, wherein the forming of the discharge structure includes forming an alternating stack including an uppermost first material, in which a first material and a second material are alternately stacked on each other, forming an alternating stack pattern by etching the alternating stack, forming a through-hole penetrating the alternating stack pattern, forming a gap-fill layer filling the through-hole, forming a mask layer including a self-aligned opening exposing the gap-fill layer and a portion of the uppermost first material disposed adjacent to the gap-fill layer, and etching the gap-fill layer with the mask layer and the exposed uppermost first material as etch barriers through the self-aligned opening to form a contact hole in the alternating stack pattern.

A method for fabricating a semiconductor device in accordance with the present disclosure may include forming a single-layered layer on a substrate, forming a multi-layered layer including an alternating stack including an uppermost hard mask material, a through-hole penetrating the alternating stack and a sacrificial material filling the through-hole on the substrate, forming a mask layer including a self-aligned opening exposing the sacrificial material of the multi-layered layer and a portion of the uppermost hard mask material disposed adjacent to the sacrificial material, and performing an etch process of etching the sacrificial material with the mask layer and the exposed uppermost hard mask material as etch barriers through the self-aligned opening, wherein the uppermost hard mask material has a higher etch selectivity than the sacrificial material and the single-layered layer, and the mask layer further includes a hole type opening exposing a portion of the single-layered layer, and the portion of the single-layered layer is etched through the hole type opening during the etch process.

A method for fabricating a semiconductor device in accordance with the present disclosure may include forming a single-layered layer on a substrate, forming a multi-layered layer including an uppermost hard mask material having a higher etch selectivity than the single-layered layer, forming a mask layer including a hole-type opening exposing a portion of the single-layered layer and a self-aligned opening exposing a portion of the uppermost hard mask material, and performing an etch process of etching the single-layered layer with the mask layer as an etch barrier and etching the multi-layered layer with the mask layer and the uppermost hard mask material as etch barriers, wherein the multi-layered layer includes a through-hole and a sacrificial material filling the through-hole and being the same material as the single-layered layer, and the sacrificial material is etched by the etch process.

According to some embodiments of the present disclosure, a method can simplify the etch process by applying a dual etch barrier during an etch process for materials with different etch selectivities.

According to some embodiments of the present disclosure, a method can prevent an arcing phenomenon during a plasma etch process by forming the discharge contact plugs. Consequently, a vertical opening with a high aspect ratio may be stably formed.

Embodiments described above are not only implemented with an apparatus and method but may be implemented with a program realizing the functions corresponding to the configurations of the embodiments or a recording medium on which the program is recorded. The embodiments may be implemented by those skilled in the art from the description of the embodiments described above.

While the present teachings have been described using a limited number of embodiments, it should be noted that other embodiments are also possible. Therefore, the limited number of possible embodiments chosen to describe the present teachings should not be construed as limiting the scope of the present teachings. Further, it is noted that the present teachings may be achieved in various ways through substitutions, changes, and modifications made to the presented embodiments. Those skilled in the art will understand that such substitutions, changes, and modifications can be made without departing from the scope of the present teachings as set forth by the following claims.

What is claimed is:

1. A method for fabricating a semiconductor device comprising, the method comprising:
    forming a dielectric layer on a first lower wiring structure, wherein the first lower wiring structure is electrically conductive;
    forming an alternating stack structure on the dielectric layer, wherein the alternating stack structure comprises first and second material layers alternately stacked with one another;
    forming an alternating stack pattern by etching the alternating stack structure;
    forming a through-hole penetrating through the alternating stack pattern;
    forming a gap-fill layer, wherein a sacrificial gap-fill layer of the gap-fill layer fills the through-hole;
    forming a mask layer over the alternating stack pattern and over the gap-fill layer, wherein the mask layer comprises a self-aligned opening overlapping the filled through-hole and overlapping a portion of an uppermost material layer of the first and second material layers adjacent to the filled through-hole; and
    forming a first contact hole through the alternating stack pattern by performing a single etch using both the mask layer and the portion of the uppermost material layer as etch barriers to remove, through the self-aligned opening, the sacrificial gap-fill layer filling the through-hole.

2. The method of claim 1, wherein:
    forming the gap-fill layer comprises forming an upper gap-fill layer of the gap-fill layer over the alternating stack pattern;
    forming the mask layer over the alternating stack pattern and over the gap-fill layer comprises forming the mask layer so that the upper gap-fill layer is between the alternating stack pattern and the mask layer; and performing the single etch using both the mask layer and the portion of the uppermost material layer as etch barriers comprises:
  etching the upper gap-fill layer using the mask layer as an etch barrier; and
  etching the sacrificial gap-fill layer using the portion of the uppermost material layer as an etch barrier.

3. The method of claim 2, wherein the self-aligned opening is formed to have a larger width than a width of the through-hole.

4. The method of claim 3, wherein forming the first contact hole comprises:
  forming the first contact hole to have the width of the self-aligned opening where the upper gap-fill layer is etched using the mask layer as the etch barrier; and
  forming the first contact hole to have the width of the through-hole where the sacrificial gap-fill layer is etched using the portion of the uppermost material layer as the etch barrier.

5. The method of claim 1 further comprising forming a second contact hole as a result of performing the single etch, wherein:
  forming the gap-fill layer comprises forming the gap-fill layer over the dielectric layer adjacent to the alternating stack pattern;
  forming the mask layer comprises forming the mask layer with a hole type opening over the dielectric layer adjacent to the alternating stack pattern;
  forming the second contact hole comprises performing the single etch using the mask layer as an etch barrier to remove, through the hole type opening, a portion of the dielectric layer adjacent to the alternating stack pattern; and
  the second contact hole passes through the gap-fill layer adjacent to the alternating stack pattern.

6. The method of claim 5 further comprising extending the second contact hole downward into the dielectric layer to a second lower wiring structure in the dielectric layer by etching the dielectric layer through the hole type opening using the mask layer as an etch barrier.

7. The method of claim 6 further comprising forming a second upper wiring structure electrically coupled to the second lower wiring structure by filling the second contact hole with a conductive material.

8. The method of claim 1 further comprising extending the first contact hole downward into the dielectric layer to the first lower wiring structure by etching the dielectric through the self-aligned opening using both the mask layer and the portion of the uppermost material layer as etch barriers.

9. The method of claim 8 further comprising forming a first upper wiring structure electrically coupled to the first lower wiring structure by filling the first contact hole with a conductive material.

10. The method of claim 1, wherein the first contact hole is self-aligned with an edge of the uppermost material layer.

11. The method of claim 1, wherein the uppermost material layer has a lower etch rate than the gap-fill layer.

12. The method of claim 1, wherein:
  the gap-fill layer comprises silicon oxide; and
  the uppermost material layer comprises at least one of:
    polysilicon;
    nitride; and
    a metallic material.

13. The method of claim 1, wherein the mask layer and the uppermost material layer both have a lower etch rate than the gap-fill layer.

14. The method of claim 13, wherein:
  the gap-fill layer comprises silicon oxide;
  the uppermost material layer comprises polysilicon; and
  the mask layer comprises a photoresist.

15. The method of claim 1, wherein forming the alternating stack structure comprises:
  forming the first material layers to include polysilicon;
  forming the second material layers to include silicon oxide; and
  forming the first material layers to be thicker than the second material layers, wherein the uppermost material layer is a first material layer.

* * * * *